(12) United States Patent
Chan et al.

(10) Patent No.: US 12,512,337 B2
(45) Date of Patent: Dec. 30, 2025

(54) METHOD FOR MANUFACTURING SEMICONDUCTOR PACKAGE AND APPARATUS FOR FLATTENING WORKPIECE

(71) Applicant: Advanced Semiconductor Engineering, Inc., Kaohsiung (TW)

(72) Inventors: Ya Fang Chan, Kaohsiung (TW); Cong-Wei Chen, Kaohsiung (TW); Kuoching Cheng, Kaohsiung (TW); Shih-Yu Wang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 419 days.

(21) Appl. No.: 18/099,867

(22) Filed: Jan. 20, 2023

(65) Prior Publication Data
US 2024/0249958 A1  Jul. 25, 2024

(51) Int. Cl.
*H01L 21/67* (2006.01)
*H01L 21/683* (2006.01)

(52) U.S. Cl.
CPC .... *H01L 21/67092* (2013.01); *H01L 21/6838* (2013.01)

(58) Field of Classification Search
CPC ........... H01L 21/67092; H01L 21/6838; H01L 21/67288
See application file for complete search history.

(56) References Cited

U.S. PATENT DOCUMENTS

| | | | | |
|---|---|---|---|---|
| 6,871,394 B2* | 3/2005 | Barretto | .............. | H01L 21/6835 29/830 |
| 7,165,711 B2* | 1/2007 | Barretto | .............. | H01L 21/6835 228/49.5 |
| 8,753,923 B2* | 6/2014 | Kobayashi | ........ | H01L 21/67092 438/464 |
| 9,272,462 B2* | 3/2016 | Okada | .................... | G03F 7/0002 |
| 9,831,170 B2* | 11/2017 | Scanlan | .................. | H01L 24/97 |
| 10,199,248 B2* | 2/2019 | Hidlao | .................... | H01L 22/20 |
| 10,373,902 B2* | 8/2019 | Scanlan | .................. | H01L 22/34 |
| 10,991,592 B2* | 4/2021 | Glukhoy | ........... | H01L 21/68792 |
| 2003/0140476 A1* | 7/2003 | Barretto | .............. | H01L 21/6838 29/428 |
| 2013/0183811 A1* | 7/2013 | Kobayashi | .............. | B24B 7/228 438/463 |
| 2013/0207309 A1* | 8/2013 | Okada | .................... | B82Y 10/00 264/293 |
| 2017/0077022 A1* | 3/2017 | Scanlan | .................. | H01L 24/19 |

(Continued)

FOREIGN PATENT DOCUMENTS

TW  202002151 A  1/2020

*Primary Examiner* — Lawrence Averick
(74) *Attorney, Agent, or Firm* — FOLEY & LARDNER LLP

(57) ABSTRACT

A method for manufacturing a semiconductor package and an apparatus for flattening a workpiece are provided. The method includes providing a panel over a stage, wherein the panel includes a lower surface facing the stage and an upper surface opposite to the lower surface; applying a first force to a first region of the upper surface of the panel along at least one direction from the panel toward the stage; and transferring the first force from the first region to a second region of the upper surface of the panel different from the first region.

19 Claims, 27 Drawing Sheets

(56) References Cited

U.S. PATENT DOCUMENTS

| | | | |
|---|---|---|---|
| 2018/0108606 A1* | 4/2018 | Scanlan | H01L 21/4853 |
| 2018/0138062 A1* | 5/2018 | Hidlao | H01L 21/67288 |
| 2020/0051826 A1* | 2/2020 | Glukhoy | H01L 21/30655 |
| 2021/0208193 A1* | 7/2021 | Persaud | H01L 21/67346 |

* cited by examiner

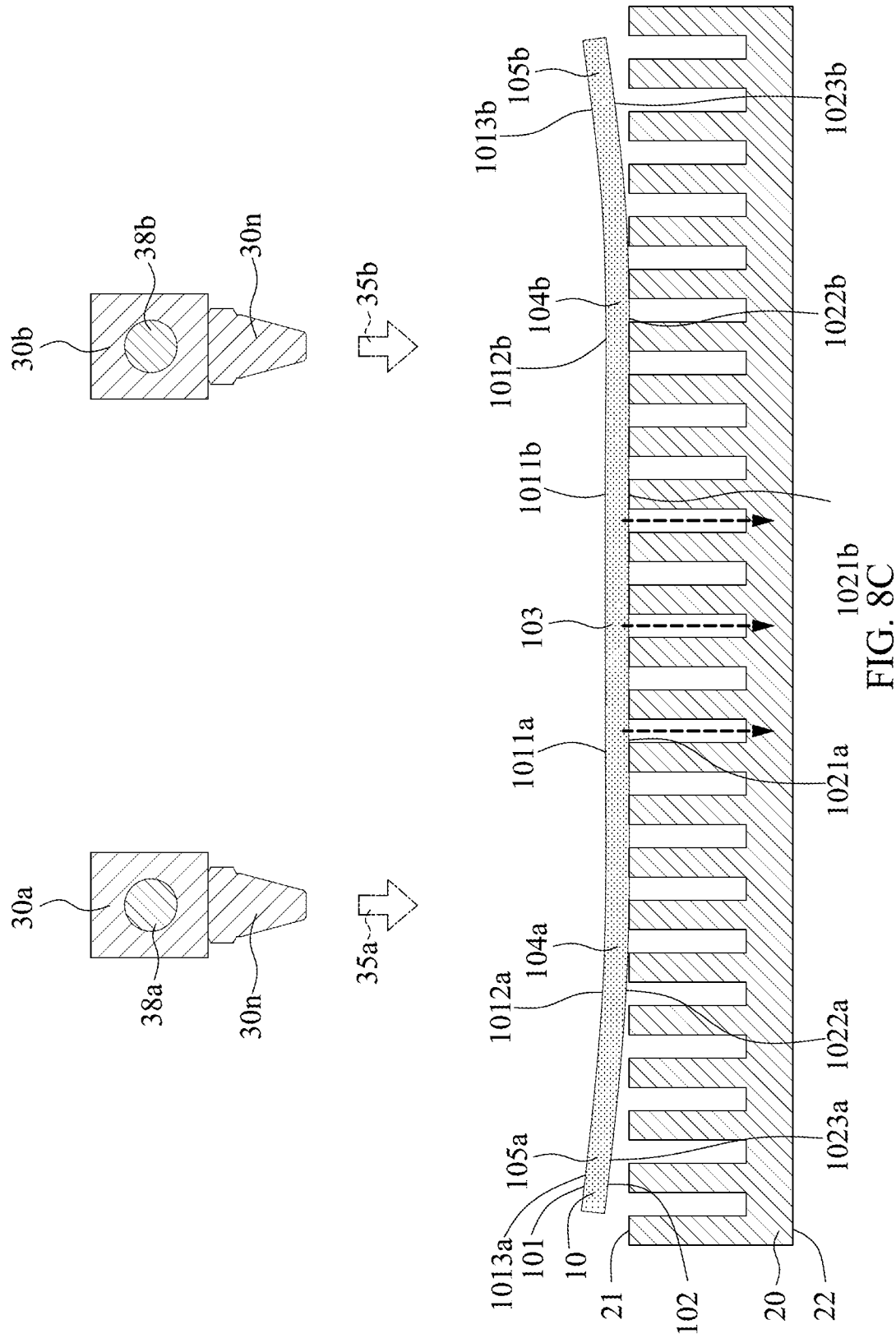

METHOD FOR MANUFACTURING SEMICONDUCTOR PACKAGE AND APPARATUS FOR FLATTENING WORKPIECE

BACKGROUND

1. Field of the Disclosure

The present disclosure relates to a method for manufacturing a semiconductor package structure and an apparatus for flattening a workpiece.

2. Description of the Related Art

In order to reduce a thickness of a semiconductor package structure, a molded wafer (panel) that is in an intermediate state of fabrication is thinned. However, the molded wafer may include a semiconductor die and a molding compound covering the semiconductor die. The coefficient of thermal expansion (CTE) mismatch between the semiconductor die and the molding compound may lead to the thinned molded wafer occurring a severe warpage. When the warped molded wafer is disposed on a vacuum stage for flattening, it is difficult to create a negative pressure or a vacuum between the vacuum stage and the warped molded wafer due to the large distance between the vacuum stage and the warped molded wafer. Therefore, the warped molded wafer is difficult to be flattened by the vacuum stage. In addition, the warped molded wafer may shift and vibrate during flattening. Thus, the subsequent manufacturing processes may be difficult to be conducted to the warped and thinned molded wafer.

SUMMARY

In some embodiments, a method for manufacturing a semiconductor package includes providing a panel over a stage, wherein the panel includes a lower surface facing the stage and an upper surface opposite to the lower surface; applying a first force to a first region of the upper surface of the panel along at least one direction from the panel toward the stage; and transferring the first force from the first region to a second region of the upper surface of the panel different from the first region.

In some embodiments, a method for manufacturing a semiconductor package includes providing a panel over a stage, wherein the panel includes a lower surface facing the stage and an upper surface opposite to the lower surface, wherein the lower surface includes a third region spaced apart from the stage by a first distance and a fourth region spaced apart from the stage by a second distance, wherein the second distance is greater than the first distance; applying a first airflow to a first region of the upper surface of the panel opposite to the third region; and applying a second airflow to a second region of the upper surface of the panel opposite to the fourth region, wherein a second blowing force of the second airflow is greater than a first blowing force of the first airflow.

In some embodiments, an apparatus for flattening a workpiece includes a stage for carrying the workpiece; and an air supply device above the stage and configured to blow the workpiece, such that a gap between the workpiece and the stage is reduced, wherein the air supply device and the stage are moveable relative to each other.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

FIGS. 8A, 8B, 8C, 8D, 8E, 8F and 8G illustrate cross-sectional views of one or more stages of an example of a method for manufacturing a semiconductor package structure according to some embodiments of the present disclosure.

DETAILED DESCRIPTION

Figure 1:
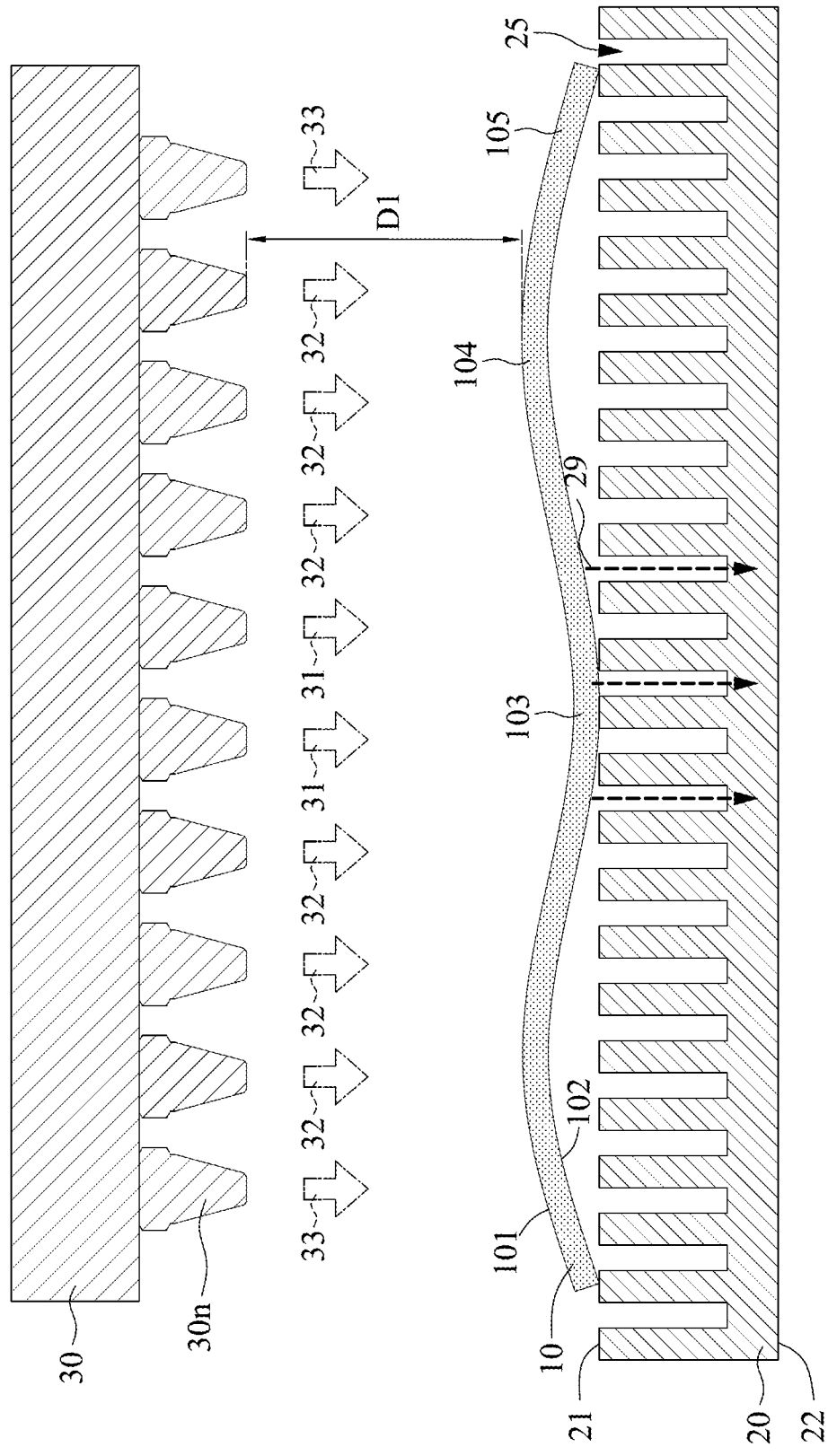
FIG. 1 illustrates a cross-sectional view of an apparatus for flattening a workpiece according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a cross-sectional view of an apparatus 1 for flattening a workpiece 10 according to some embodiments of the present disclosure. The apparatus 1 includes a stage 20 and an air supply device 30.

Figure 9:
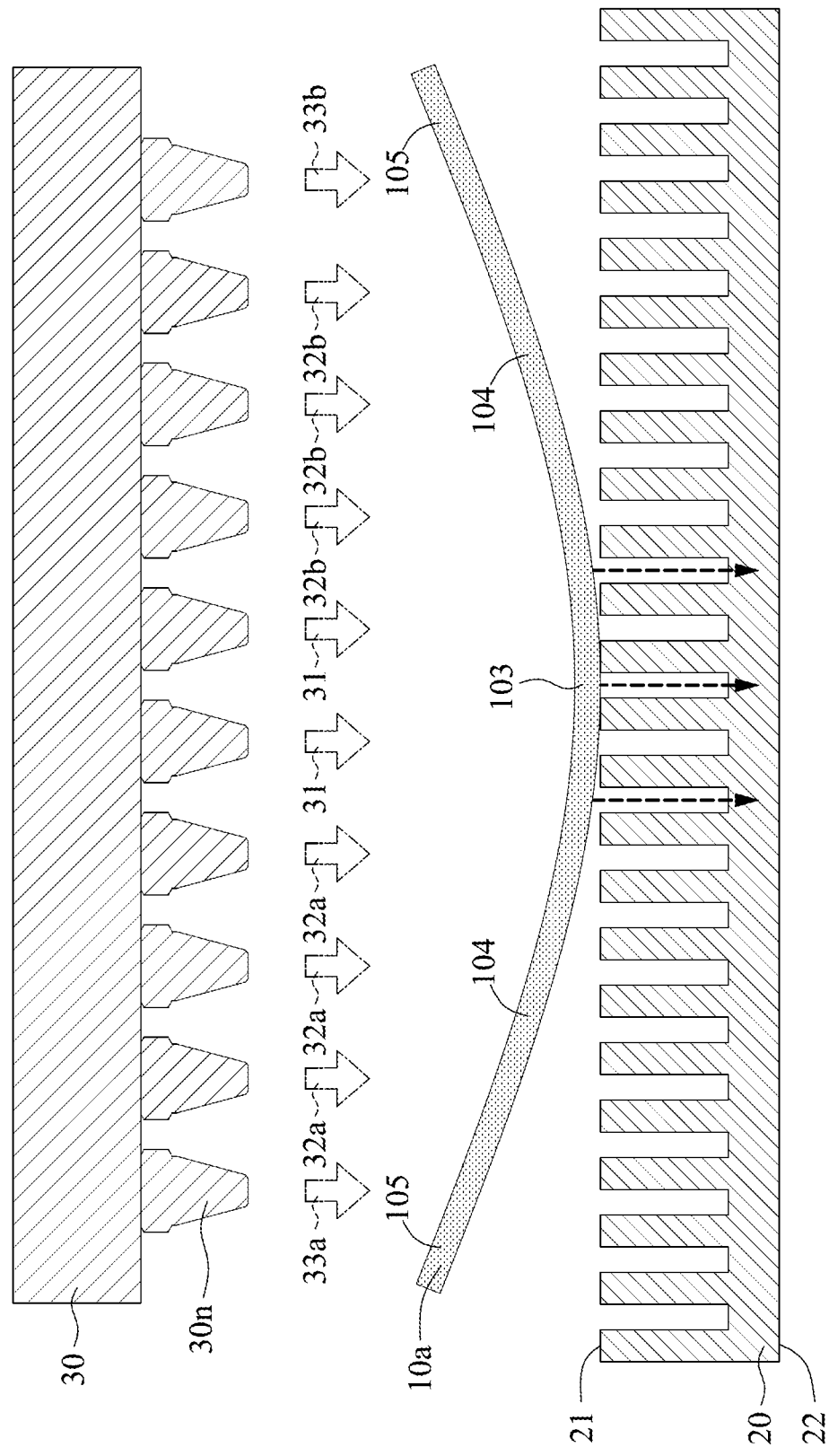
FIG. 9 illustrates a cross-sectional view of an apparatus for flattening a workpiece according to some embodiments of the present disclosure.
Figure 10:
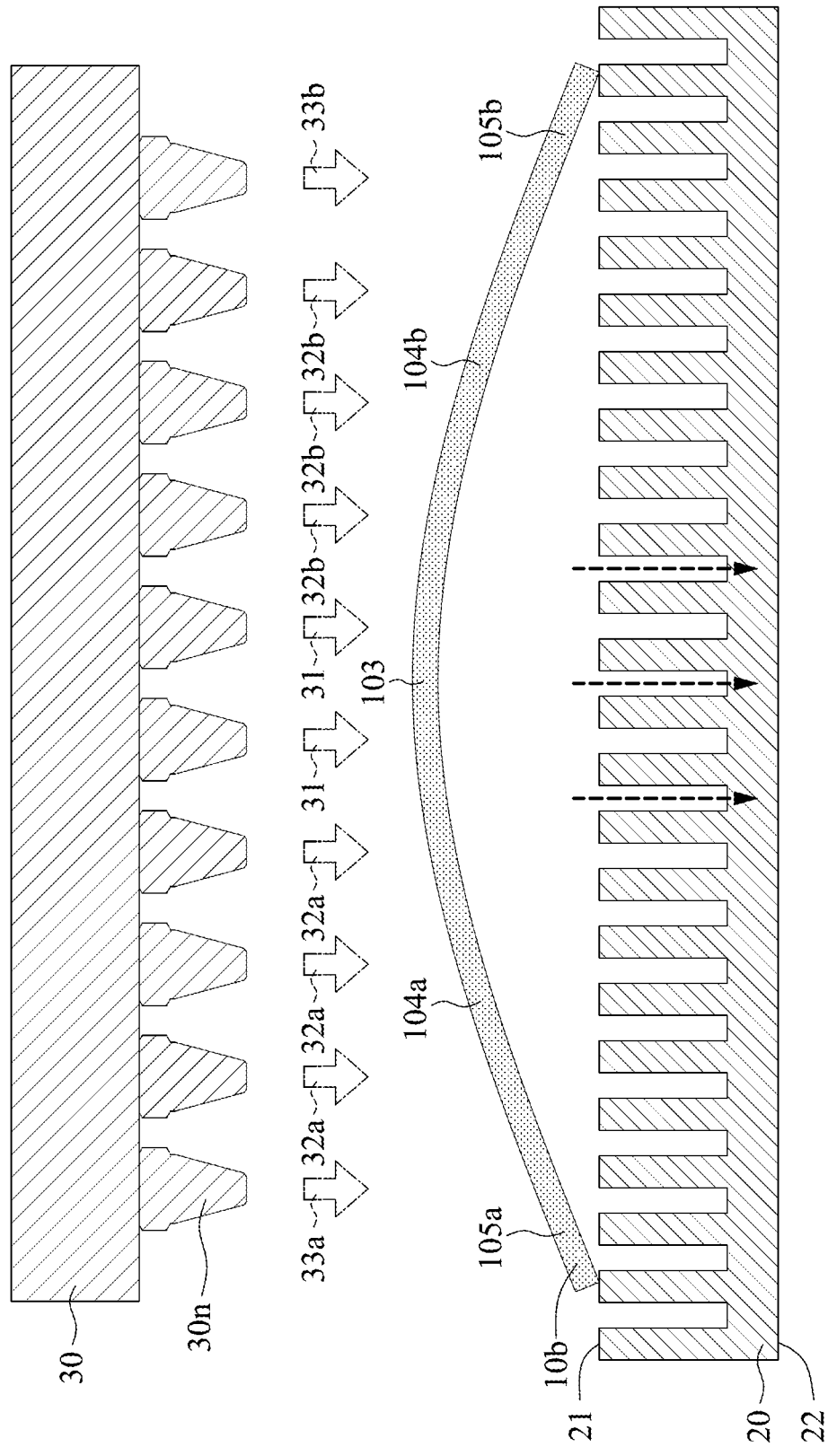
FIG. 10 illustrates a cross-sectional view of an apparatus for flattening a workpiece according to some embodiments of the present disclosure.
Figure 11:
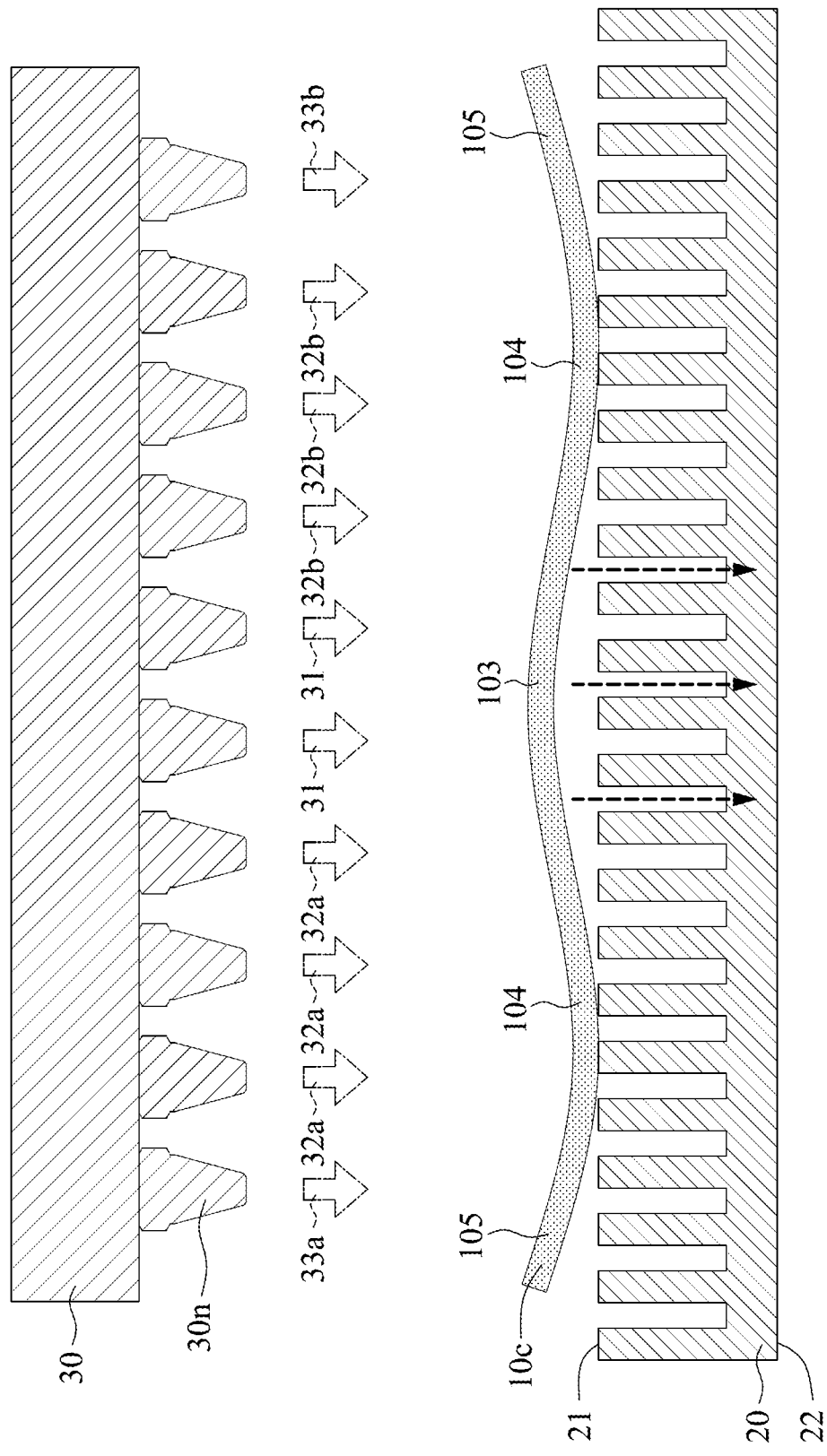
FIG. 11 illustrates a cross-sectional view of an apparatus for flattening a workpiece according to some embodiments of the present disclosure.

The workpiece 10 can be a package body, which may be in a molded wafer type or in a molded panel type, such as a molded panel including one or more electronic components (such as dies). In some embodiments, the workpiece 10 may be a panel 10. In some embodiments, the panel 10 may be warped, for example, a concave shape (as shown in FIG. 9), a convex shape (as shown in FIG. 10), an M-shape (as shown in FIG. 1), a W-shape (as shown in FIG. 11), or other warpage types.

Figure 2:
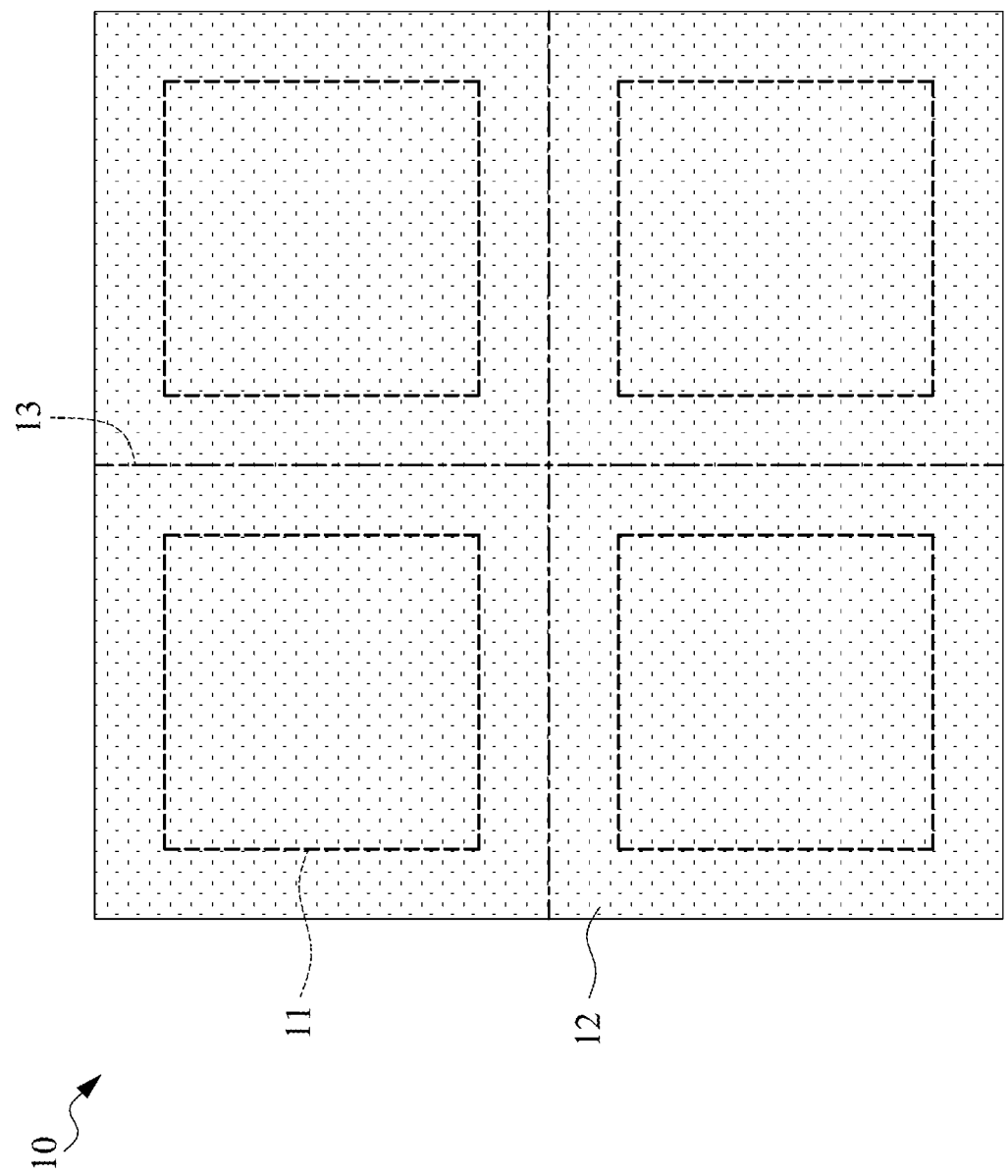
FIG. 2 illustrates a schematic top view of a panel according to some embodiments of the present disclosure.

FIG. 2 illustrates a schematic top view of a panel 10 according to some embodiments of the present disclosure. In some embodiments, FIG. 2 can be the top view of the panel 10 in FIG. 1. The panel 10 can include one or more electronic components 11 and an encapsulant 12.

Figure 4:
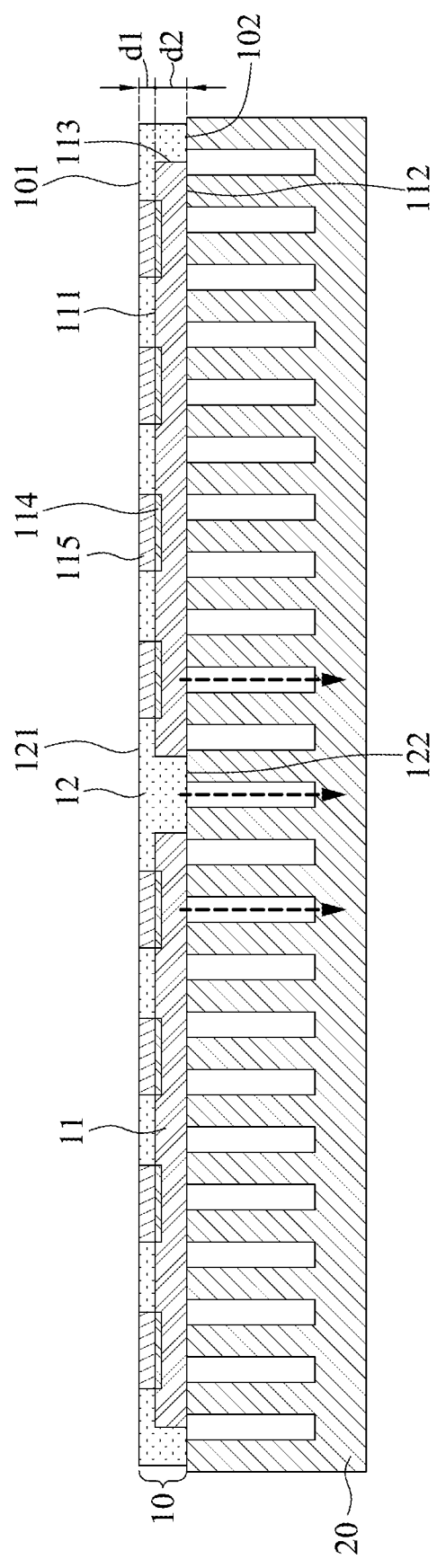
FIG. 4 illustrates a cross-sectional view of an apparatus for flattening a workpiece according to some embodiments of the present disclosure.

Referring to FIG. 2, the panel 10 can have a top surface 101 and a bottom surface 102 opposite to the top surface 101, and the panel 10 can include four electronic components 11. Each of the electronic components 11 can be a semiconductor die or a semiconductor chip, as shown in FIG. 4. The encapsulant 12 may be a cured molding compound with or without fillers, as shown in FIG. 4. The electronic components 11 can be arranged in an array. In some embodiments, the encapsulant 12 can be formed between the electronic components 11. The encapsulant 12 can cover the lateral surface of the electronic components 11. Thus, the encapsulant 12 can encapsulate the electronic components 11. The electronic components 11 can be surrounded by the encapsulant 12. In some embodiments, a scribe line 13 can be located between the electronic components 11. The panel 10 can be singulated into pieces according to the scribe line 13. The area between the electronic components 11 can be referred as the invalid area.

Referring back to FIG. 1, the stage 20 can carry the panel 10. In other words, the panel 10 can be disposed over or provided on the stage 20. The stage 20 can be a vacuum stage. In some embodiments, the bottom surface 102 of the panel 10 may be disposed adjacent to the stage 20. The stage 20 may be configured to receive the panel 10. The stage 20 has an upper surface 21 and a lower surface 22 opposite to the upper surface 21. In some embodiments, the upper surface 21 of the stage 20 can be a carrying surface for supporting the panel 10. The stage 20 may include a plurality of suction holes 25 spaced apart from each other. The suction holes 25 may be recessed from the upper surface 21. In some embodiments, the suction holes 25 may be connected to or communicated with a vacuum pump (not shown). Accordingly, a negative pressure 29 (e.g., a pressure lower than 1 atm) may be created in the suction holes 25 through the vacuum pump, and the negative pressure 29 may act on the bottom surface 102 of the panel 10 to suck and fix the panel 10. In some embodiments, the negative pressure 29 can be created between the panel 10 and the stage 20. The stage 20 can have one or more sucking surfaces (for example, the upper surface 21 or the lateral surface of the suction holes 25) for sucking the panel 10. In some embodiments, the stage 20 can be rectangle, square, circle, or any other shape suitable to the panel 10.

The air supply device 30 can include one or more nozzles 30n. For example, the air supply device 30 can include ten nozzles 30n. The air supply device 30 can provide airflows 31, 32, and 33 toward the stage 20 through the nozzles 30n. In some embodiments, the airflows 31, 32, and 33 can be injected from the nozzles 30n of the air supply device 30 toward the top surface 101 of the panel 10. The nozzles 30n of the air supply device 30 can provide a respective airflows (i.e., airflows 31, 32, and 33) toward different directions.

The air supply device 30 can provide a force toward the panel 10. In some embodiments, the force provided by the air supply device 30 can be an airflow. The air supply device 30 can provide a pressure pressing the panel 10 to the stage 20. In some embodiments, the air supply device 30 can include a control valve (not shown) for adjusting the pressure of the airflow. In some embodiments, the pressure provided by the air supply device 30 can be about or greater than 50 psi. For example, the pressure of the air supply device 30 can be 60, 70, 75, 80, 90, 100, or 110 psi.

The air supply device 30 can be an air pressure device for providing pressure (such as airflows) to the panel 10. In some embodiments, the air supply device 30 can be an ionizer holder for eliminating the static electricity. The air supply device 30 can provide airflows to the panel 10, such that the static electricity thereon can be eliminated and the panel 10 can be flattened at the same time. Using the air supply device 30 pressing the panel 10 from above, the panel 10 can be flattened and sucked on the stage 20. The air supply device 30 can eliminate the static electricity on the panel 10 and flatten the panel 10 at the same time.

In some embodiments, the air supply device 30 is disposed above the panel 10, and can be spaced apart from the panel 10 by a distance D1. The distance D1 can be defined as a vertical distance between the nozzles 30n and the top surface 101 of the panel 10. The distance D1 can be equal to or less than 40 cm. For example, the distance D1 can be about 40 cm, 30 cm, 25 cm, 20 cm, 15 cm, 10 cm, or less. As the air supply device 30 is closer to the panel 10, the panel 10 can be easier to be flattened.

The air supply device 30 can include only one nozzle 30n. Alternatively, the air supply device 30 can include a plurality of nozzles 30n. In one embodiment, the nozzles 30n of the air supply device 30 can be arranged in at least one row. In another embodiment, the nozzles 30n can be arranged in an array.

Figure 3:
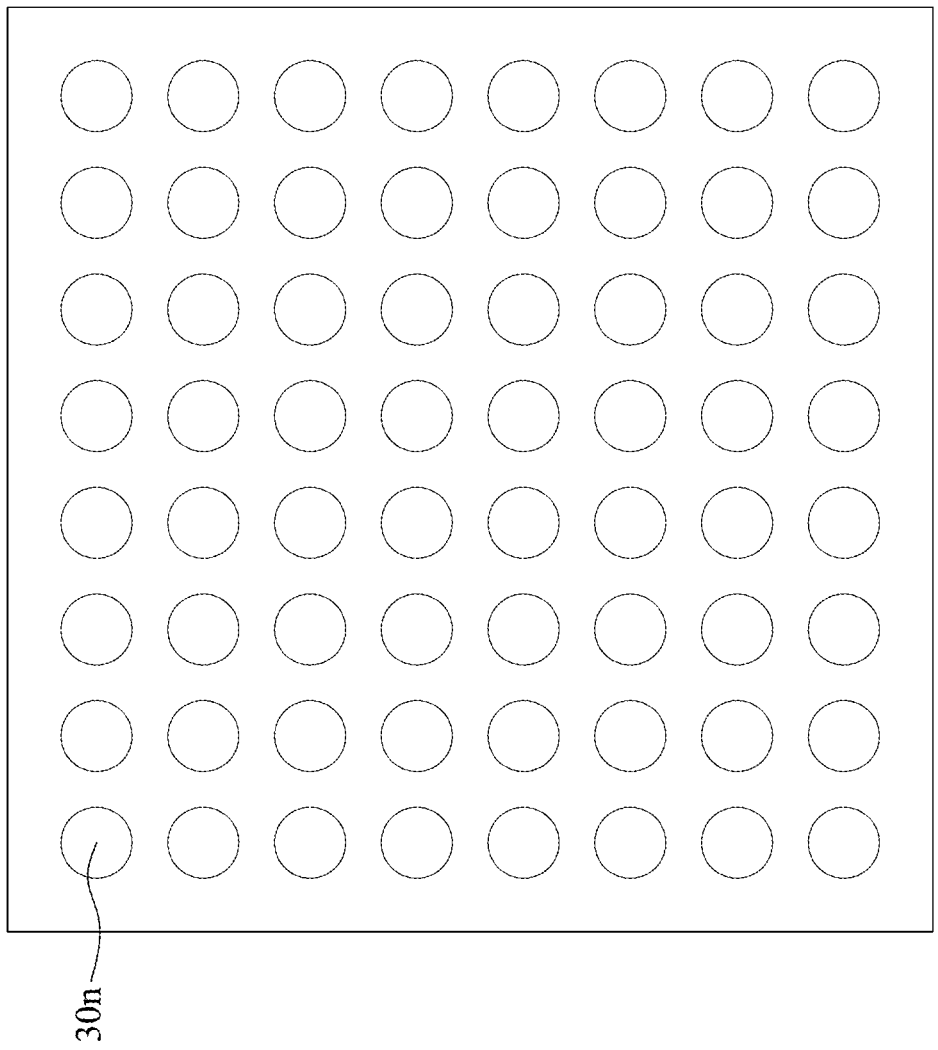
FIG. 3 illustrates a bottom view of an air supply device according to some embodiments of the present disclosure.

FIG. 3 illustrates a bottom view of an air supply device 30 according to some embodiments of the present disclosure. In some embodiments, FIG. 3 can be a bottom view of the air supply device 30 in FIG. 1. Referring to FIG. 3, the air supply device 30 can include a plurality of nozzles 30n arranged in an array. In some embodiments, the air supply device 30 can include 64 nozzles 30n. In another embodiment, the number of the nozzles 30n can be more than or less than 64 according to needs.

In some embodiments, the nozzles 30n can be arranged in 8 columns in the horizontal direction and 8 rows in the vertical direction. That is, the array has a size of 8×8. In another embodiment, the array of the nozzles 30n can be any type of array according to needs. For example, the array of the nozzles 30n can be 2×2, 3×3, 4×4, 1×4, 1×8, 4×1, 8×1 or the like.

Referring back to FIG. 1, a portion of the panel 10 can contact the stage 20, while another portion of the panel 10 is spaced apart from the stage 20. For example, a center portion 103 of the panel 10 and a periphery portion 105 of the panel 10 can contact the stage 20, while an intermediate portion 104 between the center portion 103 and the periphery portion 105 of the panel 10 is spaced apart from the stage 20. That is, the intermediate portion 104 of the panel 10 adjacent to the center portion 103 does not contact the stage 20. Accordingly, the panel 10 can be an M-shape.

To flatten the panel 10, the air supply device 30 can provide the airflows 31, 32, and 33 applied to the panel 10, such that the panel 10 can be sucked on the stage 20. For example, the airflows 31, 32, and 33 can be applied to the panel 10 before the negative pressure 29 is created. Accordingly, the panel 10 can be pressed toward the stage 20, and then the negative pressure 29 can be created between the panel 10 and the stage 20.

In some embodiments, the air supply device 30 can apply the airflow 31 to a first portion (i.e., the center portion 103) of the panel 10 in contact with the stage 20, and apply the airflow 32 to a second portion (i.e., the intermediate portion 104) of the panel 10 free from contacting the stage 20. The airflow 31 can be applied to the center portion 103 of the panel 10, which is in contact with the stage 20. Then, the air supply device 30 can provide the airflows 32 and 33 toward the intermediate portion 104 and the periphery portion 105 of the panel 10. In other words, the airflows 32 can be applied to the intermediate portion 104 of panel 10 free from contacting the stage 20, and then applied to the periphery portion 105 of the panel 10 in contact with the stage 20. In some embodiments, the airflows of the air supply device 30 can be applied to the panel 10 from the center portion 103 to the periphery portion 105. The air supply device 30 can move from a position corresponding to the center portion 103 of the panel 10 to a position corresponding to the periphery portion 105 of the panel 10. Accordingly, the panel 10 warped in M-shape can be flattened and sucked on the stage 20. In some embodiments, the pressure of the airflows 31, 32, and 33 of the air supply device 30 can be moved from a first position corresponding to the center portion 103 of the panel 10 to a second position corresponding to the periphery portion 105 of the panel 10. In some embodiments, the air supply device 30 can apply the airflow 31 to the center portion 103 of the panel 10, apply the airflow 32 to the intermediate portion 104 of the panel 10, and apply the airflow 33 to the periphery portion 105 of the panel 10 in sequence. In other words, the area of the panel 10 blown by the airflows provided by the air supply device 30 can increase. In another embodiment, the air supply device 30 can provide merely the airflow 31 and increase the pressure of the airflow 31, such that the area of the panel 10 blown by the airflow 31 can increase.

In some embodiments, the blowing force of the airflows 31, 32, and 33 of the air supply device 30 can increase in sequence. In another embodiment, the pressure of the airflows 31, 32, and 33 of the air supply device 30 can increase gradually. In some embodiments, the pressure of the airflows 31, 32, and 33 of the air supply device 30 can increase from a first portion (i.e., the center portion 103) of the panel 10 in contact with the stage 20 to a second portion (i.e., intermediate portion 104) of the panel 10 free from contacting the stage 20. The pressure of the airflows of the air supply device 30 can increase from the center portion 103 to the periphery portion 105 of the panel 10 gradually. For example, the pressure of the airflow 32 can be greater than the pressure of the airflow 31, and the pressure of the airflow 33 can be greater than the pressure of the airflow 32.

In some embodiments, the pressure of the airflows 31, 32, and 33 of the air supply device 30 can decrease gradually. In some embodiments, the pressure of the airflows 31, 32, and 33 of the air supply device 30 can decrease from a first portion (i.e., the center portion 103) of the panel 10 in contact with the stage 20 to a second portion (i.e., intermediate portion 104) of the panel 10 free from contacting the stage 20. The pressure of the airflows of the air supply device 30 can decrease from the center portion 103 to the periphery portion 105 of the panel 10 gradually. For example, the pressure of the airflow 32 can be less than the pressure of the airflow 31, and the pressure of the airflow 33 can be less than the pressure of the airflow 32.

In some embodiments, a portion of the panel 10 is pressed toward the stage 20 before a negative pressure 29 between such portion of the panel 10 and the stage 20 is created. For example, the center portion 103 of the panel 10 is pressed toward the stage 20 through the airflow 31 before the negative pressure 29 between the center portion 103 of the panel 10 and the stage 20 is created. After the center portion 103 of the panel 10 is pressed to contact the stage 20 through the airflow 31, the negative pressure 29 between the center portion 103 of the panel 10 and the stage 20 is created to suck the center portion 103 of the panel 10. Then, the air supply device 30 stops to apply the airflow 31. Subsequently, the intermediate portion 104 of the panel 10 is pressed toward the stage 20 through the airflow 32 before the negative pressure 29 between the intermediate portion 104 of the panel 10 and the stage 20 is created. After the intermediate portion 104 of the panel 10 is pressed to contact the stage 20 through the airflow 32, the negative pressure 29 between the intermediate portion 104 of the panel 10 and the stage 20 is created to suck the intermediate portion 104 of the panel 10. Then, the air supply device 30 stops to apply the airflow 32. Subsequently, the periphery portion 105 of the panel 10 is pressed toward the stage 20 through the airflow 33 before the negative pressure 29 between the periphery portion 105 of the panel 10 and the stage 20 is created. After the periphery portion 105 of the panel 10 is pressed to contact the stage 20 through the airflow 32, the negative pressure 29 between the periphery portion 105 of the panel 10 and the stage 20 is created to suck the periphery portion 105 of the panel 10. Then, the air supply device 30 stops to apply the airflow 33.

In some embodiments, the airflows 31, 32, and 33 of the air supply device can be stopped applying from a first position corresponding to the center portion 103 of the panel 10 to a second position corresponding to the periphery portion 105 of the panel 10 in sequence. The pressure of the airflows 31, 32, and 33 of the air supply device can be stopped applying from a first position corresponding to the center portion 103 of the panel 10 to a second position corresponding to the periphery portion 105 of the panel 10 in sequence. In some embodiments, the air supply device 30 can stop pressing the center portion 103 of the panel 10 to the periphery portion 105 of the panel 10 in sequence.

FIG. 4 illustrates a cross-sectional view of an apparatus 1 for flattening a workpiece according to some embodiments of the present disclosure. Referring to FIG. 4, the apparatus 1 includes the panel 10 and the stage 20. FIG. 4 shows the panel 10 is sucked on the stage 20 well. That is, the panel 10 is flattened and sucked by the stage 20.

The panel 10 may include one or more electronic components 11 and an encapsulant 12. The electronic component 11 can be semiconductor dice or semiconductor die. In some embodiments, the electronic components 11 can be disposed side by side. The electronic component 11 has a top surface 111 (e.g., an active surface), a bottom surface 112 (e.g., a backside surface) opposite to the top surface 111, and a lateral surface 113 extending between the top surface 111 and the bottom surface 112. The electronic component 11 may be disposed adjacent to the stage 20. The bottom surface 112 of the electronic component 11 can contact the stage 20. In some embodiments, the top surface 111 of the electronic component 11 can face far away from the stage 20. In some embodiments, a distance d1 between the top surface 101 of the panel 10 and the top surface 111 (i.e., the active surface) of the electronic component 11 may be less than a distance d2 between the top surface 111 (i.e., the active surface) of the electronic component 11 and the bottom surface 102 of the panel 10.

The electronic component 11 may include a plurality of conductive pads 114 and a plurality of conductive bumps 115. The conductive pads 114 may include copper, aluminum or gold. In some embodiments, the conductive pads 114 may be disposed adjacent to or exposed from the top surface 111 of the electronic component 11. The conductive bump 115 may be disposed on the conductive pad 114 and may protrude from the top surface 111 of the electronic component 11. In some embodiments, the conductive bump 115 may include copper (Cu). The conductive bump 115 may be in a pillar form.

The encapsulant 12 may be a cured molding compound with or without fillers. The encapsulant 12 may cover the top surface 111 of the electronic component 11 and the lateral surface 113 of the electronic component 11. In some embodiments, the encapsulant 12 can cover the conductive bumps 115 of the electronic component 11. Thus, the electronic component 11 is embedded or encapsulated in the encapsulant 12. The encapsulant 12 has a top surface 121 and a bottom surface 122 opposite to the top surface 121. In some embodiments, the top surface 121 of the encapsulant 12 may be ground, and the top surfaces of the conductive bumps 115 may be substantially coplanar with the top surface 121 of the encapsulant 12. Thus, the top surfaces of the conductive bumps 115 may be exposed from the top surface 121 of the encapsulant 12. The bottom surface 112 of the electronic component 11 may be substantially coplanar with the bottom surface 122 of the encapsulant 12, and they may be the bottom surface 102 of the panel 10.

As the airflows (e.g., the airflows 31, 32, 33 of FIG. 1) of the air supply device 30 provided to portions (the center portion 103, the intermediate portion 104 and the periphery portion 105 of FIG. 1) of the panel 10 in sequence, the panel 10 can be completely sucked on the stage 20. By using the contactless manner to press the panel 10 to the stage 20, the apparatus 1 can hold the panel 10 well and avoid the damage of the panel 10.

Figure 5:
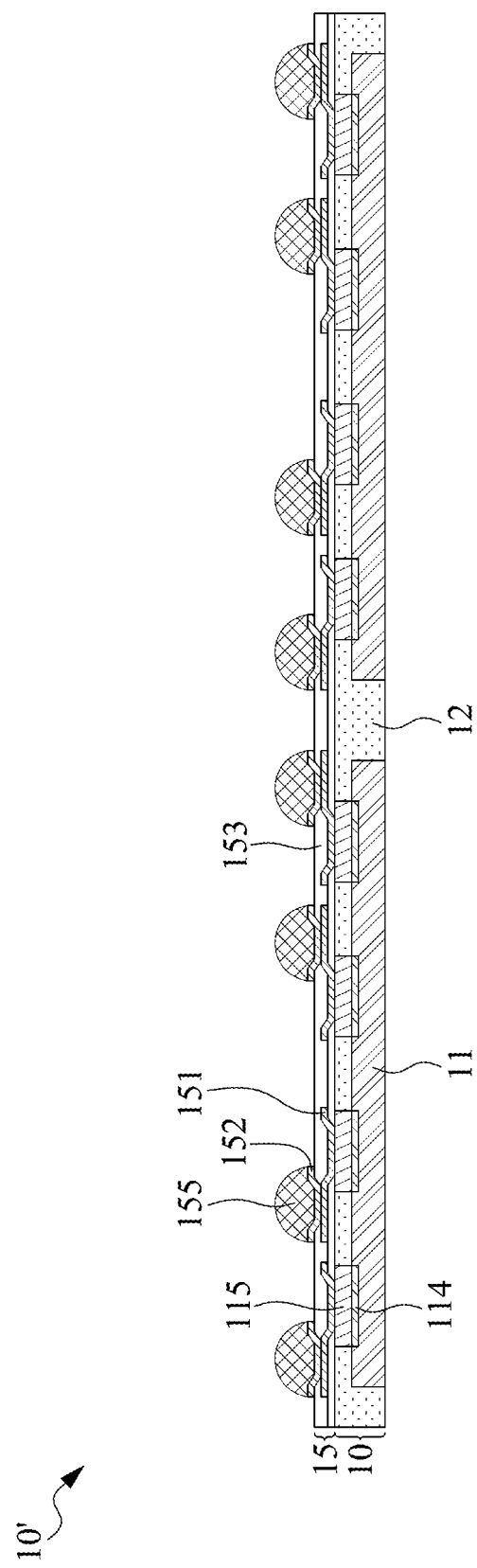
FIG. 5 illustrates a cross-sectional view of a panel according to some embodiments of the present disclosure.

FIG. 5 illustrates a cross-sectional view of a workpiece 10' according to some embodiments of the present disclosure. The workpiece 10' of FIG. 5 may be similar to the panel 10 of FIG. 4, except that workpiece 10' of FIG. 5 further includes redistribution structure 15.

In some embodiments, the redistribution structure 15 (or redistribution layer (RDL)) may be formed on the panel 10. That is, at least one exposure step, at least one development step and at least one plating step may be performed on the panel 10 to form the redistribution structure 15. The redistribution structure 15 can include conductive elements 151 and 152 and one or more dielectric layers 153. The conductive elements 151, 152 may include at least one trace, at least one inner via and at least one pad. In some embodiments, a plurality of external connectors (e.g., solder balls) 155 may be formed on and electrically connected to the redistribution structure 15 for external connection. In some embodiments, the electronic component 11 can be electrically connected to external elements through the conductive pads 114, the conductive bumps 115, the conductive elements 151 and 152, and the external connectors 155.

In some embodiments, the workpiece 10' (including the panel 10 and the redistribution structure 15) may be sawed or singulated to form a plurality of semiconductor package structures. In some embodiments, the workpiece 10' can be singulated according to the scribe line 13 (shown in FIG. 2).

Figure 6A:
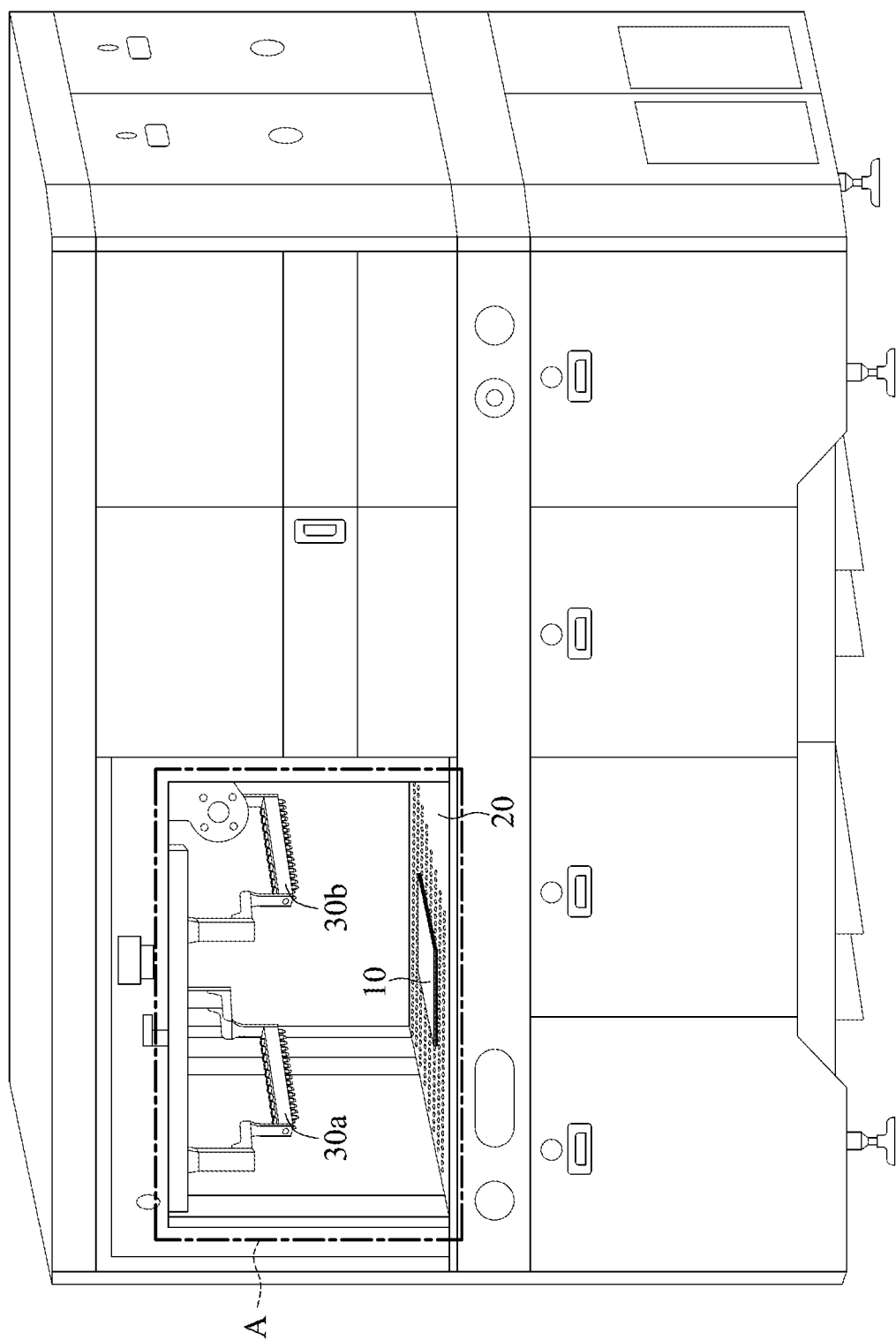
FIG. 6A illustrates a perspective view of an apparatus for flattening a workpiece according to some embodiments of the present disclosure.
Figure 6B:
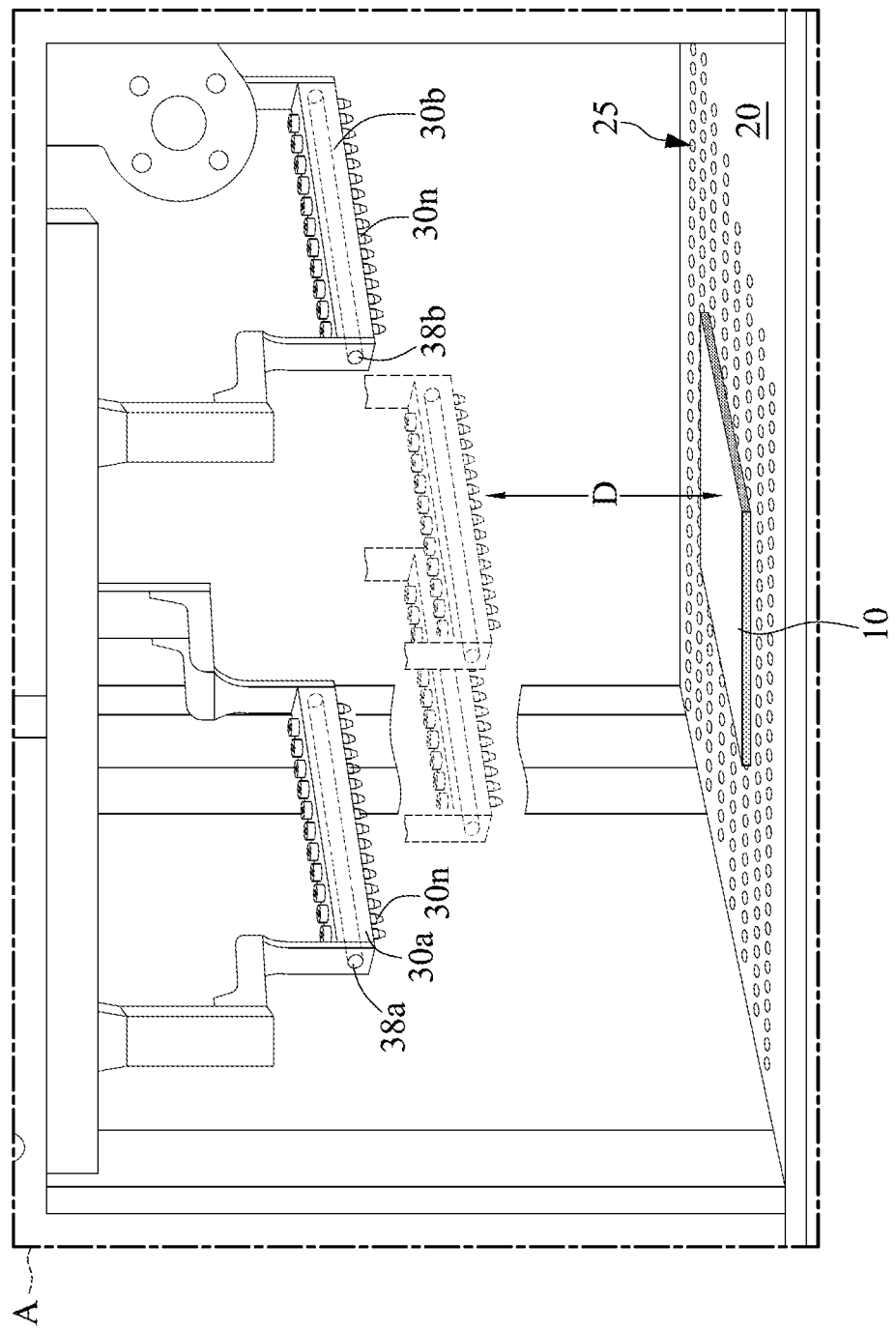
FIG. 6B illustrates an enlarged perspective view of a region "A" in FIG. 6A.

FIG. 6A illustrates a perspective view of an apparatus 6 for flattening a workpiece 10 according to some embodiments of the present disclosure. FIG. 6B illustrates an enlarged view of a region "A" in FIG. 6A.

Referring to FIG. 6A, the apparatus 6 can includes the panel 10, the stage 20, and two air supply devices 30a and 30b. In some embodiments, the panel 10 can be placed on the stage 20. The stage 20 can create a negative pressure to suck the panel 10. In some embodiments, the stage 20 can provide a vacuum condition to suck the panel 10 through a plurality of suction holes 25. The stage 20 can include one or more suction holes 25 for sucking the panel 10. In some embodiments, the suction holes 25 may be connected to or communicated with a vacuum pump (not shown). Accordingly, a negative pressure can be created between the suction holes 25 and the panel 10 through the vacuum pump, and thus the panel 10 can be sucked and fixed on the stage 20.

In some embodiments, the air supply devices 30a and 30b can be above the stage 20. The air supply devices 30a and 30b can be configured to blow the panel 10 (or workpiece), such that a gap between the panel 10 and the stage 20 can be reduced. In some embodiments, the air supply devices 30a and 30b may be a strip and may include at least one row of nozzles 30n. In some embodiments, the air supply devices 30a and 30b can move horizontally. That is, the air supply devices 30a and 30b can move left or right. The air supply devices 30a and 30b can move vertically. That is, the air supply devices 30a and 30b can move up and down. In some embodiments, the air supply devices 30a and 30b can move front and back. The air supply devices 30a and 30b can move in the x, y, or z direction. In some embodiments, the air supply devices 30a and 30b can have a travel distance greater than a length or a width of the stage 20. In some embodiments, the apparatus 6 can include one or more air supply devices. Although FIGS. 6A and 6B show one embodiment of the air supply device, the types of the air supply device can be different according to needs.

Referring to FIG. 6B, the air supply devices 30a and 30b can move closer to the panel 10. Therefore, the air supply devices 30a and 30b can press the panel 10 stronger. The air supply devices 30a and 30b can be located above the panel in a distance D about 40 cm. In some embodiments, the distance D can be less than 40 cm. The distance D can be about 20 cm or less than 20 cm.

In another embodiment, the stage 20 may be moveable. That is, the stage 20 and the air supply devices 30a and 30b are moveable relative to each other. In such case, the air supply devices 30a and 30b may locate at a fixed position and the stage 20 can move relative to the air supply device 30a and 30b, such that the airflows of the air supply device 30a and 30b can be applied to the desired portions of the panel 10.

In some embodiments, the air supply device 30a can include a shaft 38a. The shaft 38a can be a rotating axis of the air supply device 30a. The shaft 38a can be coupled to a motor (not shown), such that the air supply device 30a can be configured to rotate along the shaft 38a. The shaft 38a can penetrate the air supply device 30a. In some embodiments, the nozzles 30n (or outlets) of the air supply device 30a can be connected to the shaft 38a, such that the shaft 38a can adjust the direction of the airflows provided by the nozzles (or outlets) 30n. That is, the direction of the nozzles 30n (or outlets) of the air supply device 30a can be adjusted by rotating the shaft 38a. In some embodiments, the air supply device 30b can include a shaft 38b. The shaft 38b can be a rotating axis of the air supply device 30b. The shaft 38b can be coupled to a motor (not shown), such that the air supply device 30b can be configured to rotate along the shaft 38b. The shaft 38b can penetrate the air supply device 30b. In some embodiments, the nozzles 30n (or outlets) of the air supply device 30b can be connected to the shaft 38b, such that the shaft 38b can adjust the direction of the airflows provided by the nozzles (outlets) 30n. That is, the direction of the nozzles 30n (or outlets) of the air supply device 30b can be adjusted by rotating the shaft 38b.

Figure 8A:
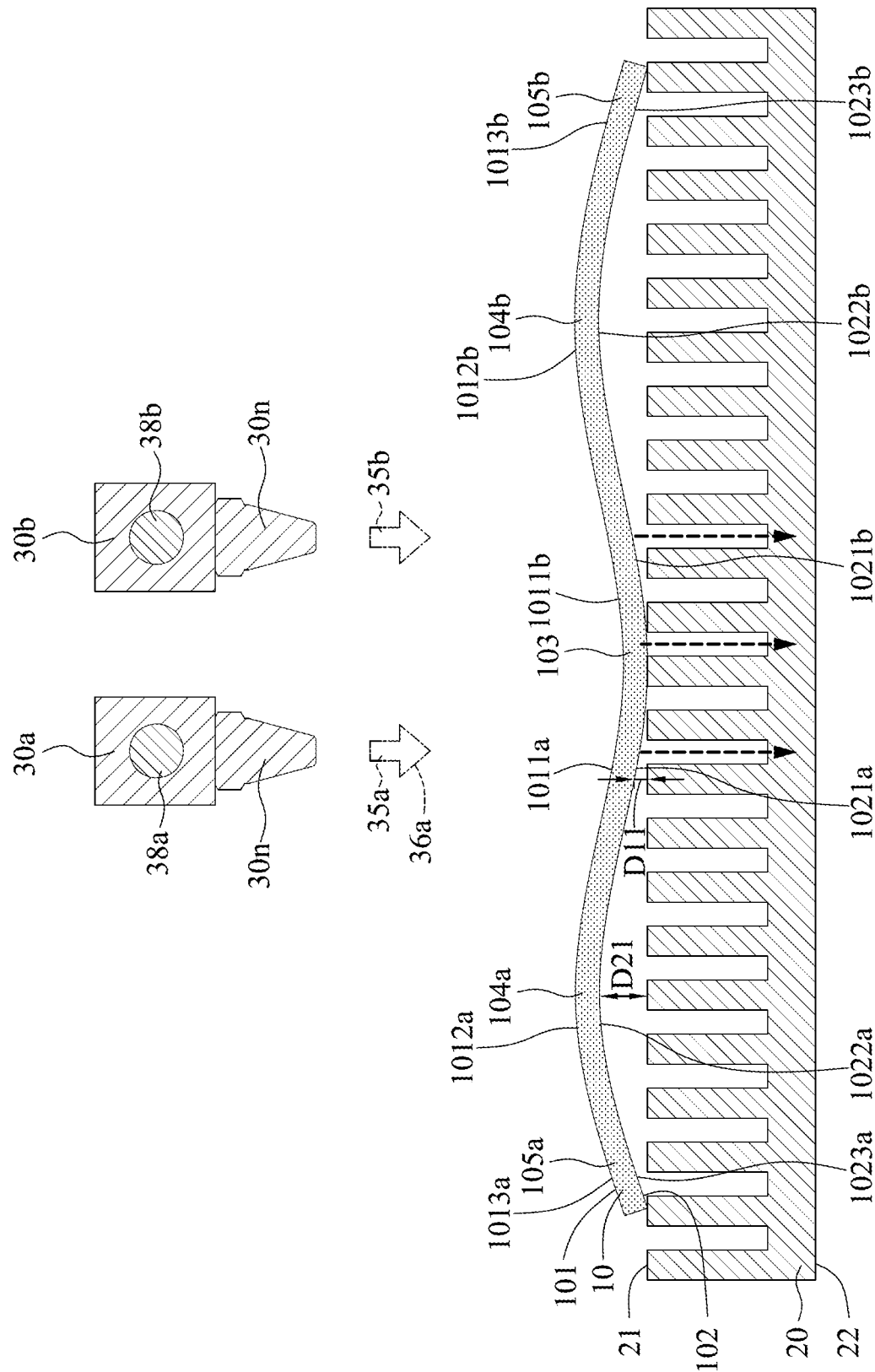

Referring to FIGS. 6A and 6B, the apparatus 6 for flattening a workpiece (such as the panel 10) includes a stage 20 for carrying the workpiece (i.e., the panel 10) and an air supply device 30a above the stage 20 and configured to blow the workpiece (i.e., the panel 10), such that a gap (for example, the distance D11 or D21 as shown in FIG. 8A) between the workpiece (i.e., the panel 10) and the stage 20 is reduced, wherein the air supply device 30a and the stage 20 are moveable relative to each other. In some embodiments, the air supply device 30a includes an air knife. In some embodiments, the air supply device 30a includes a shaft 38a and an outlet (such as the nozzle 30n) connected to the shaft 38a, such that the shaft 38a adjusts a direction of the airflow 35a provided by the outlet 30n (will be discussed later in FIGS. 8A, 8E, 8F, and 8G). In some embodiments, the air supply device 30a includes a plurality of nozzles 30n configured to provide a respective airflows 35a toward different directions. In some embodiments, the air supply device 30a is an ionizer holder for eliminating static electricity.

Figure 6C:
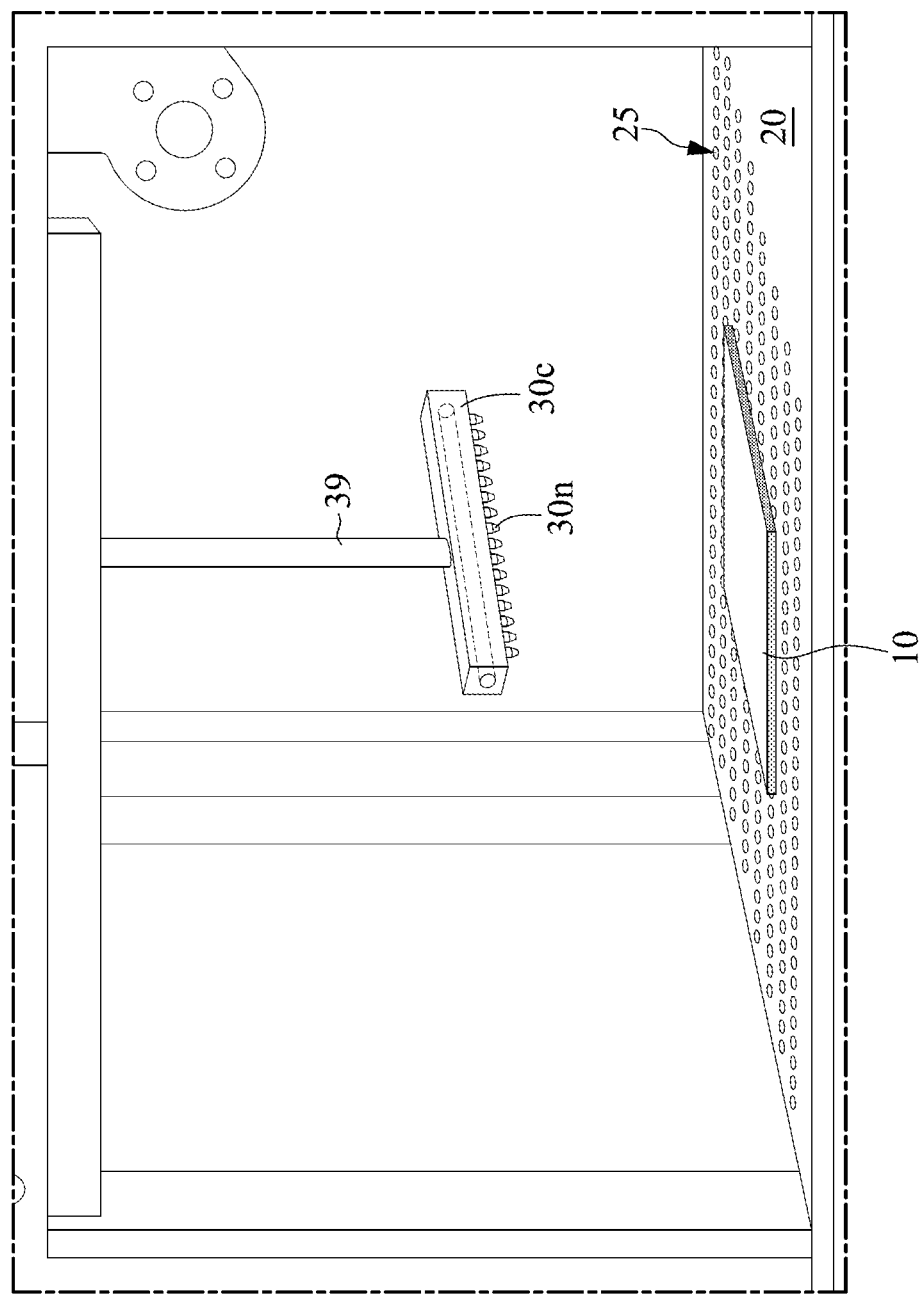
FIG. 6C illustrates a perspective view of an apparatus for flattening a workpiece 10 according to some embodiments of the present disclosure.

FIG. 6C illustrates a perspective view of an apparatus 6' for flattening a workpiece 10 according to some embodiments of the present disclosure. The apparatus 6' in FIG. 6C is similar to the apparatus 6 in FIGS. 6A and 6B, except that the air supply device 30c is a different type. Referring to FIG. 6C, the apparatus 6' may include at least one air supply device 30c having a shaft 39. In some embodiments, the shaft 39 can locate at the center of the air supply device 30c. The shaft 39 can be a pillar. For example, the shaft 39 can be a cylinder.

The shaft 39 can be a rotating axis of the air supply device 30c. The shaft 39 can be coupled to a motor (not shown), such that the air supply device 30c can be configured to rotate along the shaft 39. The shaft 39 can be attached to the air supply device 30c. The shaft 39 can have a portion inserted in the air supply device 30a. In some embodiments, the direction of the nozzles 30n (or outlets) of the air supply device 30c can be adjusted by rotating the shaft 39.

In some embodiments, the air supply device 30c can move closer to the panel 10. Therefore, the air supply device 30c can blow or press the panel 10 stronger. The air supply device 30c can be located above the panel in a distance D about 40 cm. In some embodiments, the distance D can be less than 40 cm. The distance D can be about 20 cm or less than 20 cm.

Figure 7A:
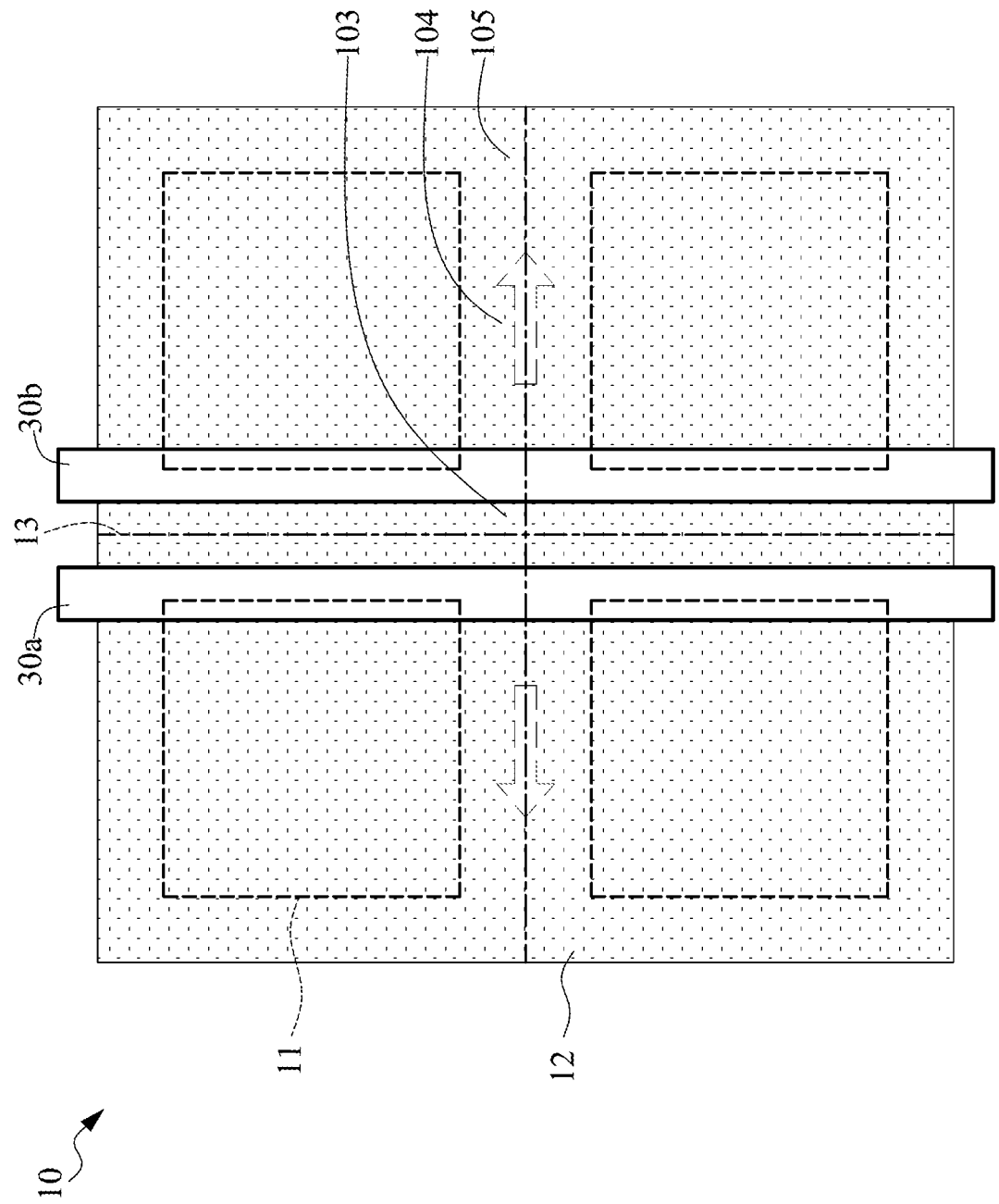
FIGS. 7A, 7B, 7C and 7D illustrate cross-sectional views of one or more stages of an example of a method for manufacturing a semiconductor package structure according to some embodiments of the present disclosure.
Figure 7B:
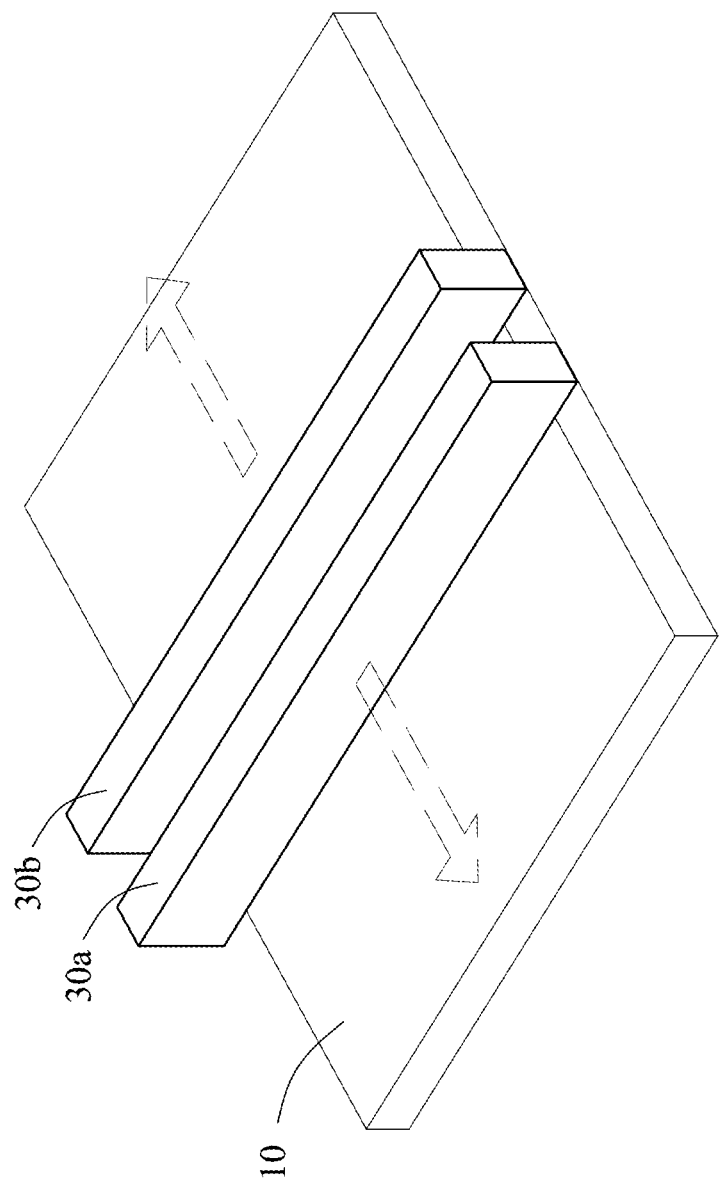

FIGS. 7A, 7B, 7C and 7D illustrate cross-sectional views of one or more stages of an example of a method for manufacturing a semiconductor package structure according to some embodiments of the present disclosure. Referring to FIGS. 7A and 7B, wherein FIG. 7B illustrates a perspective view of FIG. 7A, the air supply devices 30a and 30b provide airflows to the center portion 103 of the panel 10. According to the present method, the air supply devices 30a and 30b can move toward the edge of the panel 10. In some embodiments, the air supply device 30a can extend in a direction parallel to an edge of the panel 10. Similarly, the air supply device 30b can extend in the direction parallel to the edge of the panel 10.

Figure 7C:
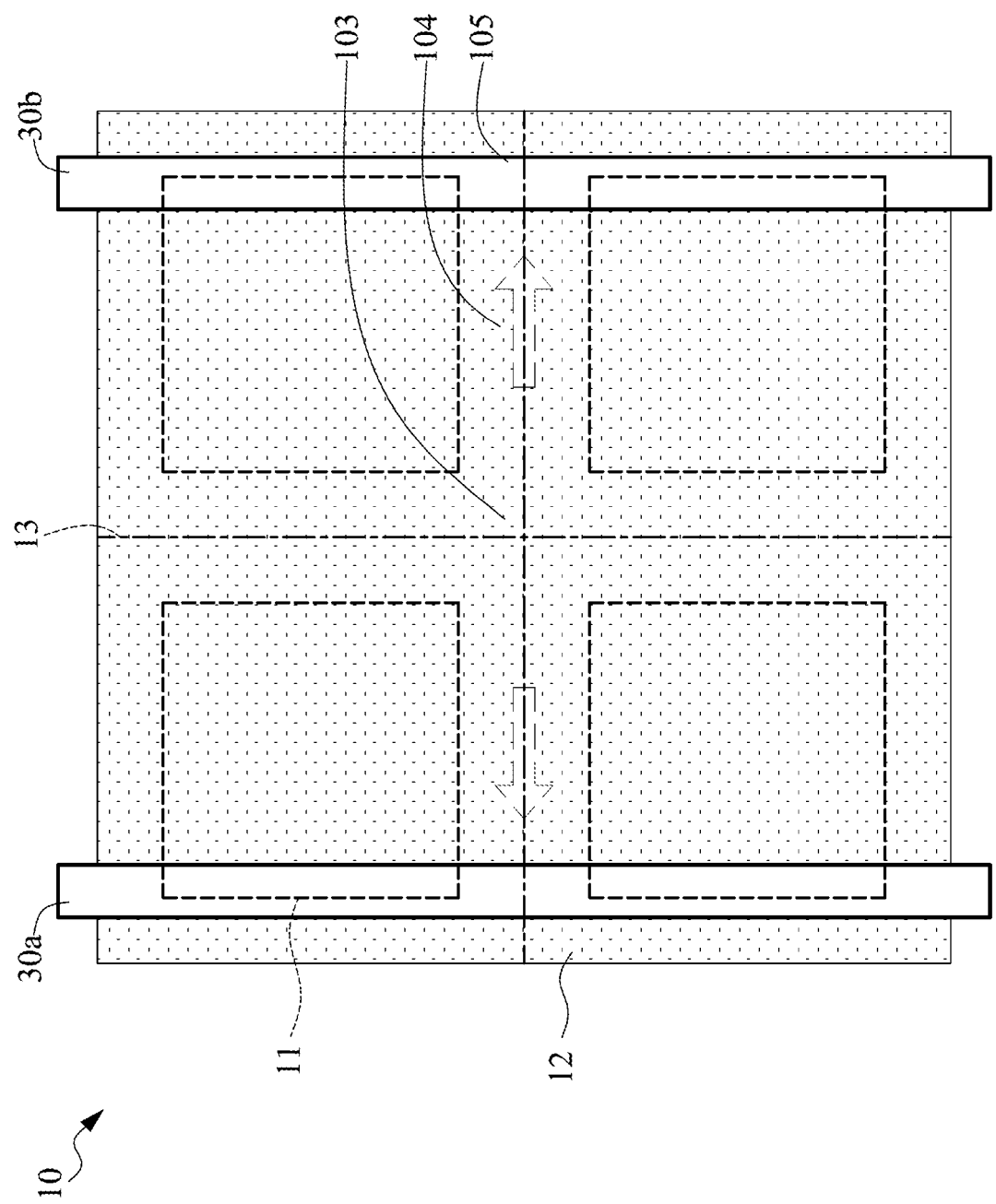
Figure 7D:
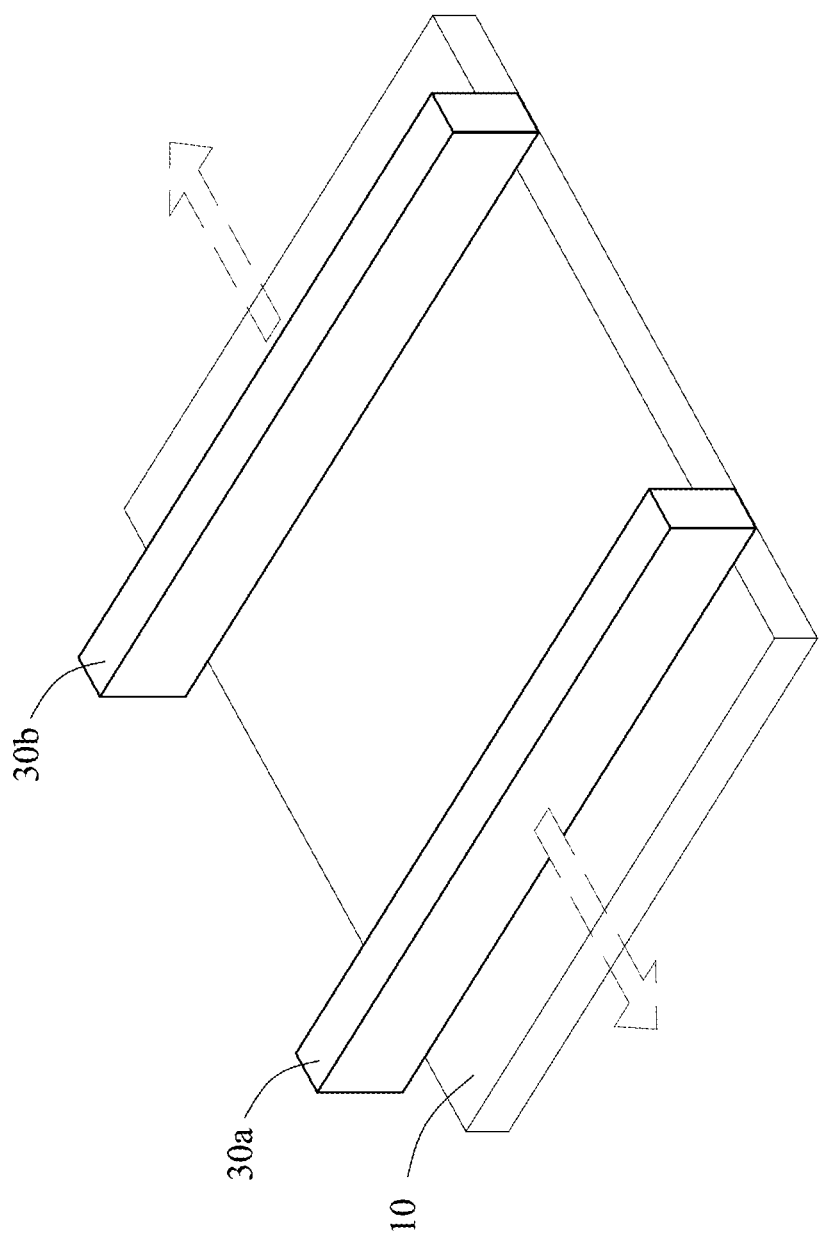

Referring to FIGS. 7C and 7D, wherein FIG. 7D illustrates a perspective view of FIG. 7C, the air supply devices 30a and 30b move from the center portion 103 to the periphery portion 105 of the panel 10, such that the air supply devices 30a and 30b provide airflows to the periphery portions 105 of the panel 10.

FIGS. 8A, 8B, 8C, 8D, 8E, 8F and 8G illustrate cross-sectional views of one or more stages of an example of a method for manufacturing a semiconductor package structure according to some embodiments of the present disclosure. In some embodiments, FIGS. 8A, 8B, 8C, and 8D show an example of the method for manufacturing a semiconductor package structure by moving the air supply devices 35a and 35b. In some embodiments, FIGS. 8A, 8E, 8F, and 8G show another example of the method for manufacturing a semiconductor package structure by rotating the air supply devices 35a and 35b. In some embodiments, the air supply devices 35a and 35b may move and rotate concurrently (not shown).

Referring to FIG. 8A, the apparatus 1 includes a panel 10, a stage 20, two air supply devices 30a and 30b. In some embodiments, the panel 10 is placed on the stage 20. The stage 20 supports the panel 10. The air supply devices 30a and 30b are above the stage 20. In some embodiments, the air supply device 30a is adjacent to the air supply device 30b. The air supply devices 30a and 30b are above the center portion 103 of the panel 10. The elevation of the air supply device 30a with respect to the stage 20 may be identical to the elevation of the air supply device 30b with respect to the stage 20. In another embodiment, the elevation of the air supply device 30a can differ from that of the air supply device 30b with respect to the stage 20.

The air supply devices 30a and 30b can include one or more nozzles 30n for providing airflows. For example, the air supply device 30a may include one nozzle 30n. Alternatively, the air supply device 30a can include multiple nozzles 30n arranged in a row or in an array. In some embodiments, the air supply device 30b may include one nozzle 30n. Alternatively, the air supply device 30b can include multiple nozzles 30n arranged in a row or in an array.

In some embodiments, the air supply device 30a can provide an airflow 35a toward the stage 20. The airflow 35a can be perpendicular to the top surface 21 of the stage 20. In some embodiments, the airflow 35a can have a direction 36a perpendicular to the top surface 21 of the stage 20. That is, the direction 36a of the airflow 35a is vertical. In another embodiment, the direction of the airflow 35a can be non-perpendicular to the top surface 21 of the stage 20 by rotating the air supply device 30a along the shaft 38a (as shown in FIGS. 8A, 8E, 8F, and 8G). The air supply device 30a can provide the airflow 35a pressing the center portion 103 of the panel 10. In some embodiments, the air supply device 30a can includes an air knife. In some embodiments, the air flow 35a provided by the air supply device 30a can be configured to reduce a static electricity of the panel 10. For example, the air supply device 30a can be an ionizer holder.

In some embodiments, the air supply device 30b can provide an airflow 35b toward the stage 20. The airflow 35b can be perpendicular to the top surface 21 of the stage 20. In another embodiment, the direction of the airflow 35b can be non-perpendicular to the top surface 21 of the stage 20 by rotating the air supply device 30b along the shaft 38b (as shown in FIGS. 8A, 8E, 8F, and 8G). The air supply device 30b can provide the airflow 35b pressing the center portion 103 of the panel 10 to contact the stage 20. Thus, a negative pressure may be created between the center portion 103 of the panel 10 and the stage 20. Thereby, the center portion 103 of the panel 10 may be sucked and fixed on the stage 20. In some embodiments, the air supply device 30b can include an air knife. However, meanwhile, a first intermediate portion 104a of the panel 10 between the center portion 103 of the panel 10 and a first periphery portion 105a of the panel 10 may be separated from or spaced apart from the stage 20, and a second intermediate portion 104b of the panel 10 between the center portion 103 of the panel 10 and a second periphery portion 105b of the panel 10 may be separated from or spaced apart from the stage 20.

In some embodiments, the top surface 101 (or upper surface) of panel 10 can include center regions 1011a and 1011b, intermediate region 1012a and 1012b, and periphery regions 1013a and 1013b. The center regions 1011a and 1011b can be adjacent to the center portion 103 of the panel 10. The intermediate region 1012a can be adjacent to the first intermediate portion 104a of the panel 10. The intermediate region 1012b can be adjacent to the second intermediate portion 104b of the panel 10. The periphery region 1013a can be adjacent to the first periphery portion 105a of the panel 10. The intermediate region 1013b can be adjacent to the second periphery portion 105b of the panel 10. In some embodiments, the intermediate region 1012a and the periphery region 1013a are closer to an edge of the panel 10 than the center region 1011a is.

In some embodiments, the bottom surface 102 (or lower surface) of panel 10 can include center regions 1021a and 1021b, intermediate region 1022a and 1022b, and periphery regions 1023a and 1023b. The center regions 1021a and 1021b can be adjacent to the center portion 103 of the panel 10. The intermediate region 1022a can be adjacent to the first intermediate portion 104a of the panel 10. The intermediate region 1022b can be adjacent to the second intermediate portion 104b of the panel 10. The periphery region 1023a can be adjacent to the first periphery portion 105a of the panel 10. The intermediate region 1023b can be adjacent to the second periphery portion 105b of the panel 10.

In some embodiments, the center region 1021a of the bottom surface 102 of the panel 10 corresponds to the center region 1011a of the top surface 101 of the panel 10. The center region 1021a of the bottom surface 102 of the panel 10 is opposite to the center region 1011a of the top surface 101 of the panel 10. The center region 1021a of the bottom surface 102 of the panel 10 is under the center region 1011a of the top surface 101. In other words, the center region 1011a of the top surface 101 of the panel 10 is over the center region 1021a of the bottom surface 102.

The center region 1021b of the bottom surface 102 of the panel 10 is opposite to the center region 1011b of the top surface 101 of the panel 10. In some embodiments, the intermediate region 1022a of the bottom surface 102 of the panel 10 is opposite to the intermediate region 1012a of the top surface 101 of the panel 10. The intermediate region 1022b of the bottom surface 102 of the panel 10 is opposite to the intermediate region 1012b of the top surface 101 of the panel 10. In some embodiments, the periphery region 1023a of the bottom surface 102 of the panel 10 is opposite to the periphery region 1013a of the top surface 101 of the panel 10. The periphery region 1023b of the bottom surface 102 of the panel 10 is opposite to the periphery region 1013b of the top surface 101 of the panel 10.

The center region 1021a of the bottom surface 102 of the panel 10 is spaced apart from the stage 20 by a distance D11. In some embodiments, the center region 1021b of the bottom surface 102 of the panel 10 can be spaced apart from the stage 20 by a distance, which may be identical to or different from the distance D11. The bottom surface 102 has at least a part between the center regions 1021a and 1021b in contact with the stage 20.

The intermediate region 1022a of the bottom surface 102 of the panel 10 is spaced apart from the stage 20 by a distance D21. In some embodiments, the intermediate region 1022b of the bottom surface 102 of the panel 10 can be spaced apart from the stage 20 by a distance, which may be identical to or different from the distance D21. In some embodiments, the distance D21 can be greater than the distance D11. For example, the distance D21 may be the greatest distance between the bottom surface 102 of the panel 10 and the stage 20.

The periphery regions 1023a and 1023b of the bottom surface 102 of the panel 10 is spaced apart from the stage 20 by a distance, which may be identical to or less than the distance D21. In some embodiments, the periphery regions 1023a and 1023b may has a part contacting the stage 20.

In some embodiments, the airflow 35a provided by the air supply device 30a can be applied to the center region 1011a of the upper surface 101 of the panel 10 along a direction from the panel 10 toward the stage 20. Thus, a negative pressure may be created between the center region 1021a of the bottom surface 102 of the panel 10 and the stage 20. In other words, the negative pressure may be created between the center region 1021a of the bottom surface 102 of the panel 10 and the stage 20 after the center region 1021a contacting the stage 20. Thereby, that stage 20 can suck the center region 1021a of the bottom surface 102 of the panel 10. After the negative pressure between the center region 1021a of the bottom surface 102 of the panel 10 and the stage 20 is created, the airflow 35a provided by the air supply device 30a can stop applying to the center region 1021a of the bottom surface 102 of the panel 10. In some embodiments, the air supply device 30a can eliminate the airflow 35a to the center region 1011a of the upper surface 101 of the panel 10, after the negative pressure between the center region 1021a of the bottom surface 102 of the panel 10 and the stage 20 is created.

The airflow 35a can be perpendicular to the top surface 21 of the stage 20. That is, an angle between the blowing direction of the airflow 35a and the top surface 21 of the stage 20 can be 90 degree. Accordingly, the distance D11 between the center region 1021a of the bottom surface 102 and the stage 20 can be decreased by the airflow 35a.

In addition, the airflow 35*b* provided by the air supply device 30*b* can be applied to the center region 1011*b* of the upper surface 101 of the panel 10 along a direction from the panel 10 toward the stage 20. Thus, a negative pressure may be created between the center region 1021*b* of the bottom surface 102 of the panel 10 and the stage 20. Thereby, that stage 20 can suck the center region 1021*b* of the bottom surface 102 of the panel 10. After the negative pressure between the center region 1021*b* of the bottom surface 102 of the panel 10 and the stage 20 is created, the airflow 35*b* provided by the air supply device 30*b* can stop applying to the center region 1021*b* of the bottom surface 102 of the panel 10. In some embodiments, the air supply device 30*b* can eliminate the airflow 35*b* to the center region 1011*b* of the upper surface 101 of the panel 10, after the negative pressure between the center region 1021*b* of the bottom surface 102 of the panel 10 and the stage 20 is created.

The airflow 35*b* can be perpendicular to the top surface 21 of the stage 20. That is, an angle between the blowing direction of the airflow 35*b* and the top surface 21 of the stage 20 can be 90 degree. Accordingly, the distance between the center region 1021*b* of the bottom surface 102 and the stage 20 can be decreased by the airflow 35*b*.

In some embodiments, after the negative pressure between the center region 1021*b* of the bottom surface 102 of the panel 10 and the stage 20 is created, the airflow 35*a* provided by the air supply device 30*a* can stop applying to the center region 1011*a* of the bottom surface 102 of the panel 10.

Figure 8B:
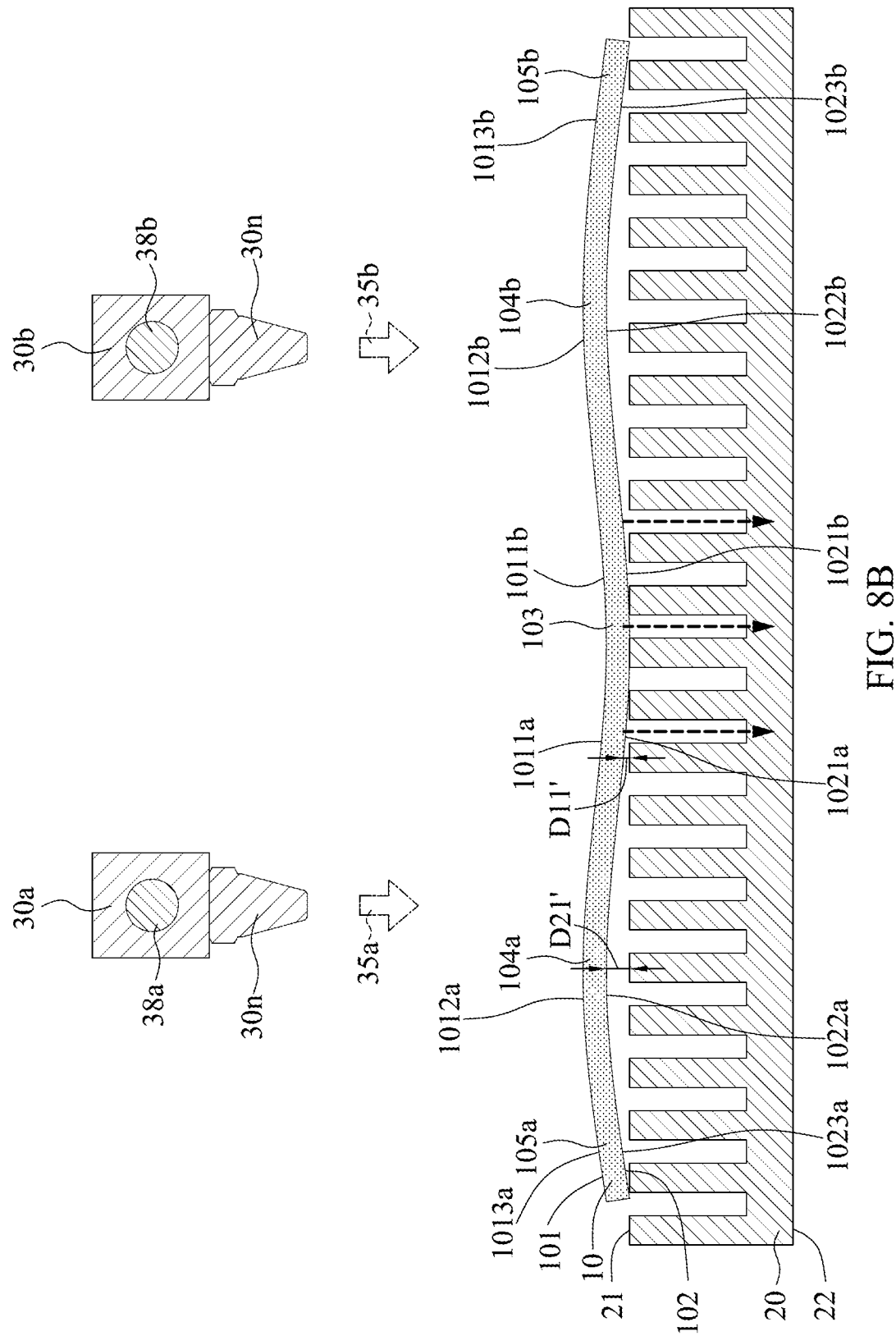

Referring to FIG. 8B and FIG. 8C, the air supply device 30*a* can move toward the first periphery portion 105*a* of the panel 10, and the air supply device 30*b* can move toward the second periphery portion 105*b* of the panel 10. The air supply device 30*a* can provide the airflow 35*a* to press the first intermediate portion 104*a* of the panel 10 to contact the stage 20. Thus, a negative pressure may be created between the first intermediate portion 104*a* of the panel 10 and the stage 20. Thereby, the first intermediate portion 104*a* of the panel 10 may be sucked and fixed on the stage 20. In addition, the air supply device 30*b* can provide the airflow 35*b* to press the second intermediate portion 104*b* of the panel 10 to contact the stage 20. Thus, a negative pressure may be created between the second intermediate portion 104*b* of the panel 10 and the stage 20. Thereby, the second intermediate portion 104*b* of the panel 10 may be sucked and fixed on the stage 20. However, meanwhile, the first periphery portion 105*a* and the second periphery portion 105*b* of the panel 10 may be separated from or spaced apart from the stage 20.

Referring to FIG. 8B and FIG. 8C, the air supply device 30*a* can move toward the periphery region 1013*a* of top surface 101 of the panel 10, and the air supply device 30*b* can move toward the periphery region 1013*b* of top surface 101 of the panel 10. In some embodiments, the air supply device 30*a* can move from the center region 1011*a* to the intermediate region 1012*a* of the top surface 101 of the panel 10. The air supply device 30*a* (and the nozzles 30*n* thereof) can move so as to transfer the blowing force (of the airflow 35*a*) from the center region 1011*a* to the intermediate region 1012*a* of the top surface 101 of the panel 10. In some embodiments, the air supply device 30*b* can move from the center region 1011*b* to the intermediate region 1012*b* of the top surface 101 of the panel 10. The air supply device 30*b* (and the nozzles 30*n* thereof) can move so as to transfer the blowing force (of the airflow 35*b*) from the center region 1011*b* to the intermediate region 1012*b* of the top surface 101 of the panel 10.

Referring to FIGS. 8A and 8B, the air supply device 30*a* can provide the airflow 35*a* to blow or press the center region 1011*a* of the top surface 101 of the panel 10, such that the distance D11 between the center region 1021*a* of the bottom surface 102 of the panel 10 and the stage 20 can be decreased to the distance D11', and then the center region 1021*a* of the bottom surface 102 can contact the stage 20. That is, the distance D11' in FIG. 8B is less than the distance D11 in FIG. 8A. Thus, a negative pressure may be created between the center region 1021*a* of the bottom surface 102 of the panel 10 and the stage 20.

The air supply device 30*a* can provide the airflow 35*a* to blow or press the intermediate region 1012*a* of the top surface 101 of the panel 10, such that the distance D21 between the intermediate region 1022*a* of the bottom surface 102 of the panel 10 and the stage 20 can be decreased to the distance D21', and then the intermediate region 1022*a* of the bottom surface 102 can contact the stage 20. That is, the distance D21' in FIG. 8B is less than the distance D21 in FIG. 8A. Thus, a negative pressure may be created between the intermediate region 1022*a* of the bottom surface 102 of the panel 10 and the stage 20. Thereby, the intermediate portion 1022*a* of the bottom surface 102 may be sucked on the stage 20. In some embodiments, the blowing force (pressure) of the airflow 35*a* applied to the intermediate region 1012*a* of the top surface 101 of the panel 10 can be greater than the blowing force (pressure) of the airflow 35*a* applied to the center region 1011*a* of the top surface 101 of the panel 10. That is, the pressure of the airflow 35*a* can increase when the air supply device 30*a* moves from the center region 1011*a* of the top surface 101 toward the periphery region 1013*a* of top surface 101 of the panel 10.

In addition, the air supply device 30*b* can provide the airflow 35*b* to blow or press the intermediate region 1012*b* of the top surface 101 of the panel 10, such that the distance between the intermediate region 1022*b* of the bottom surface 102 of the panel 10 and the stage 20 can be decreased, and then the intermediate region 1022*b* of the bottom surface 102 can contact the stage 20. Thus, a negative pressure may be created between the intermediate portion 1022*b* of the bottom surface 102 of the panel 10 and the stage 20. Thereby, the intermediate portion 1022*b* of the bottom surface 102 may be sucked and fixed on the stage 20. However, meanwhile, the periphery region 1023*a* and the periphery region 1023*b* of the bottom surface 102 of the panel 10 may be separated from or spaced apart from the stage 20. In some embodiments, the blowing force (pressure) of the airflow 35*b* applied to the center region 1011*b* of the top surface 101 of the panel 10 can be less than the blowing force (pressure) of the airflow 35*b* applied to the intermediate region 1012*b* of the top surface 101 of the panel 10. That is, the pressure of the airflow 35*b* can increase when the air supply device 30*b* moves from the center region 1011*b* of the top surface 101 toward the periphery region 1013*b* of top surface 101 of the panel 10.

Figure 8D:
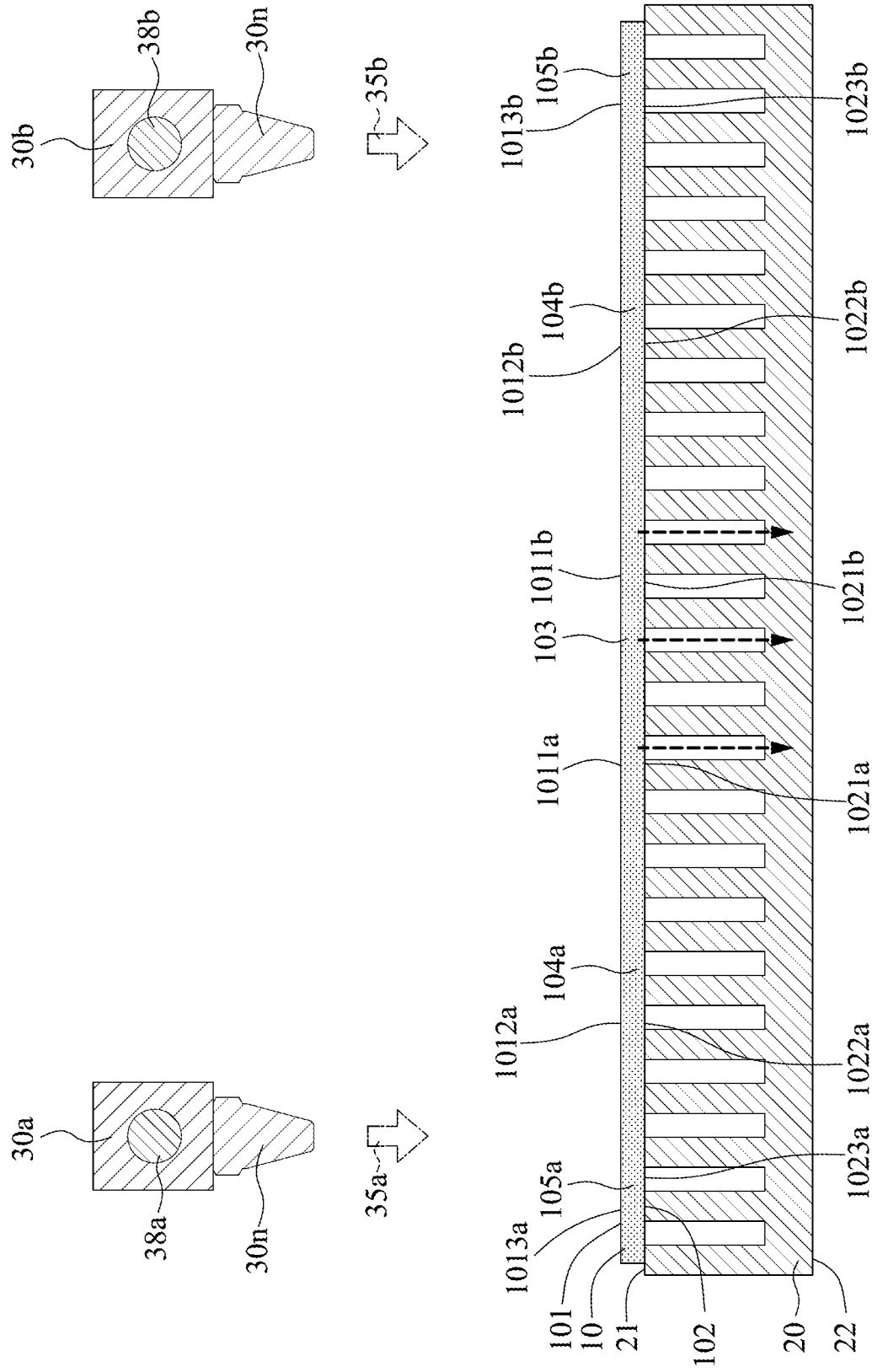

Referring to FIG. 8D, the air supply device 30*a* can move to a location above the first periphery portion 105*a* of the panel 10, and the air supply device 30*b* can move to a location above the second periphery portion 105*b* of the panel 10. The air supply device 30*a* can provide the airflow 35*a* to press the first periphery portion 105*a* of the panel 10 to contact the stage 20. Thus, a negative pressure may be created between the first periphery portion 105*a* of the panel 10 and the stage 20. Thereby, the first periphery portion 105*a* of the panel 10 may be sucked and fixed on the stage 20. In addition, the air supply device 30*b* can provide the airflow 35*b* to press the second periphery portion 105*b* of the panel 10 to contact the stage 20. Thus, a negative pressure may be created between the second periphery portion 105b of the panel 10 and the stage 20. Thereby, the second periphery portion 105b of the panel 10 may be sucked and fixed on the stage 20.

In some embodiments, the air supply device 30a can move to a location above the periphery region 1013a of the top surface 101 of the panel 10, and the air supply device 30b can move to a location above the periphery region 1013b of the top surface 101 of the panel 10. The air supply device 30a can provide the airflow 35a to press the periphery region 1013a of the top surface 101 of the panel 10, so that the periphery region 1023a of the bottom surface 102 of the panel 10 can contact the stage 20. Thus, a negative pressure may be created between the periphery region 1023a of the bottom surface 102 of the panel 10 and the stage 20. Thereby, the periphery region 1023a of the bottom surface 102 of the panel 10 may be sucked on the stage 20. In addition, the air supply device 30b can provide the airflow 35b to press the periphery region 1013b of the top surface 101 of the panel 10, so that the periphery region 1023b of the bottom surface 102 of the panel 10 can contact the stage 20. Thus, a negative pressure may be created between the second periphery portion 105b of the panel 10 and the stage 20. Thereby, the periphery region 1023b of the bottom surface 102 of the panel 10 may be sucked on the stage 20.

As shown in FIGS. 8A, 8B, 8C and 8D, the warped panel 10 can be flattened with the pressure provided by the air supply devices 30a and 30b. The air supply devices 30a and 30b can press the top surface 101 of the panel 10, and the stage 20 can suck the bottom surface 102 of the panel 10. Accordingly, the warped panel 10 can be flattened and sucked on the stage 20.

Referring to FIGS. 8A, 8B, 8C and 8D, the method for manufacturing a semiconductor package includes providing a panel 10 over a stage 20, wherein the panel 10 includes a lower surface 102 facing the stage and an upper surface 101 opposite to the lower surface 101; applying a first force (for example, the pressure of the airflow 35a of the air supply device 30a) to a first region (for example, the center region 1011a) of the upper surface 101 of the panel 10 along at least one direction (such as the direction 36a) from the panel 10 toward the stage 20; and transferring the first force from the first region to a second region (for example, the intermediate region 1012a) of the upper surface 101 of the panel 101 different from the first region 1011a. In some embodiments, applying the first force includes applying an airflow (such as the airflow 35a) to the first region (for example, the center region 1011a) of the upper surface 101 of the panel 10. In one embodiment, sucking a third region (for example, the center region 1021a) of the lower surface 102 of the panel 10 is conducted after applying the first force (i.e., the airflow 35a). In some embodiments, the third region (i.e., the center region 1021a) is opposite to the first region (1011a). In one embodiment, sucking the third region (i.e., the center region 1021a) of the lower surface 102 of the panel 10 is before transferring the first force (i.e., the airflow 35a) to the second region (for example, the intermediate region 1012a). In some embodiments, the second region (for example, the intermediate region 1012a) is closer to an edge of the panel 10 than the first region is. In some embodiments, increasing a blowing force of the first force (for example, increasing the pressure of the airflow 35a) from the first region (i.e., the center region 1011a) to the second region (for example, the intermediate region 1012a). In some embodiments, the at least one direction (for example, the directions 36b, 36c, and 36d) is non-perpendicular to a surface (for example, the top surface 21) of the stage 20 for supporting the panel 10.

In some embodiments, the method for manufacturing a semiconductor package includes providing a panel 10 over a stage 20, wherein the panel 10 includes a lower surface 102 facing the stage 20 and an upper surface 101 opposite to the lower surface 102, wherein the lower surface 102 includes a third region (for example, the center region 1021a) spaced apart from the stage 20 by a first distance (such as the distance D11) and a fourth region (for example, the intermediate region 1022a) spaced apart from the stage by a second distance (such as the distance D21), wherein the second distance (such as the distance D21) is greater than the first distance (such as the distance D11); applying a first airflow (such as the airflow 35a in FIG. 8A) to a first region (such as the center region 1011a) of the upper surface 101 of the panel 10 opposite to the third region (i.e., the center region 1021a); and applying a second airflow (for example, the airflow 35a in FIG. 8B) to a second region (such as the intermediate region 1012a) of the upper surface 101 of the panel 10 opposite to the fourth region (i.e., the intermediate region 1022a), wherein a second blowing force of the second airflow (the pressure of the airflow 35a in FIG. 8B) is greater than a first blowing force of the first airflow (the pressure of the airflow 35a in FIG. 8A). In some embodiments, applying the first airflow (i.e., the airflow 35a in FIG. 8A) decreases the first distance (i.e., the distance D11). That is, the distance D11 in FIG. 8A can decrease to the distance D11' in FIG. 8B. In some embodiments, creating a negative pressure (for example, the negative pressure 29) between the third region (i.e., the center region 1021a) and the stage 20 is conducted after the third region (i.e., the center region 1021a) contacting the stage 20. In some embodiments, eliminating the first airflow (i.e., the airflow 35a in FIG. 8A) to the first region (i.e., the center region 1011a) is conducted after creating the negative pressure. That is, after third region (i.e., the center region 1021a) is sucked on the stage 20, the first airflow (i.e., the airflow 35a) to the first region (i.e., the center region 1011a) stop blowing. In some embodiments, applying the second airflow (i.e., the airflow 35a in FIG. 8B) to decrease the second distance (i.e., the distance D21) after eliminating the first airflow (i.e., the airflow 35a in FIG. 8A). That is, the distance D21 in FIG. 8A can decrease to the distance D21' in FIG. 8B.

FIGS. 8A, 8E, 8F, and 8G show another example of the method for manufacturing a semiconductor package structure by rotating the air supply devices 35a and 35b, according to some embodiments of the present disclosure.

Figure 8E:
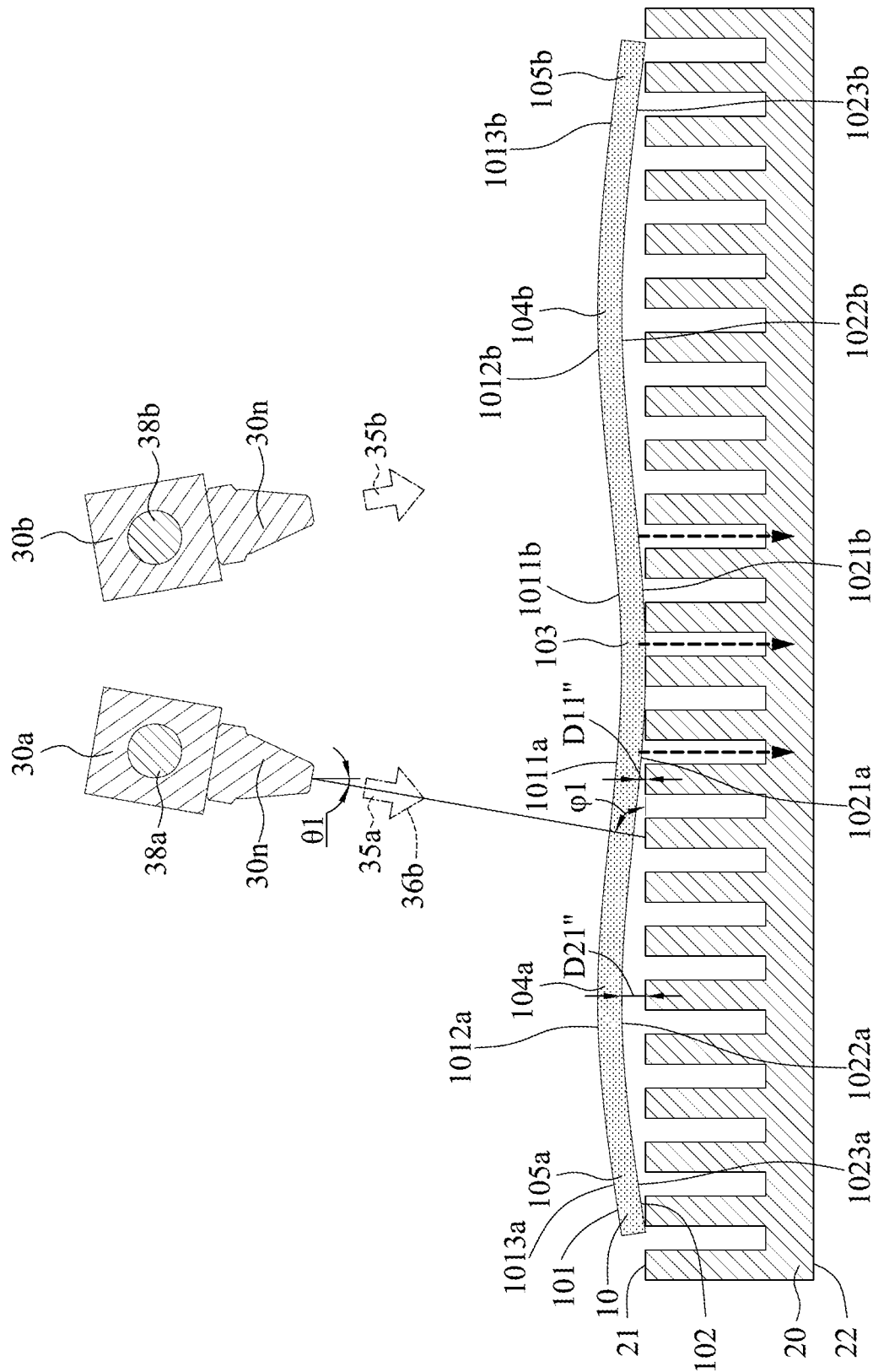
Figure 8F:
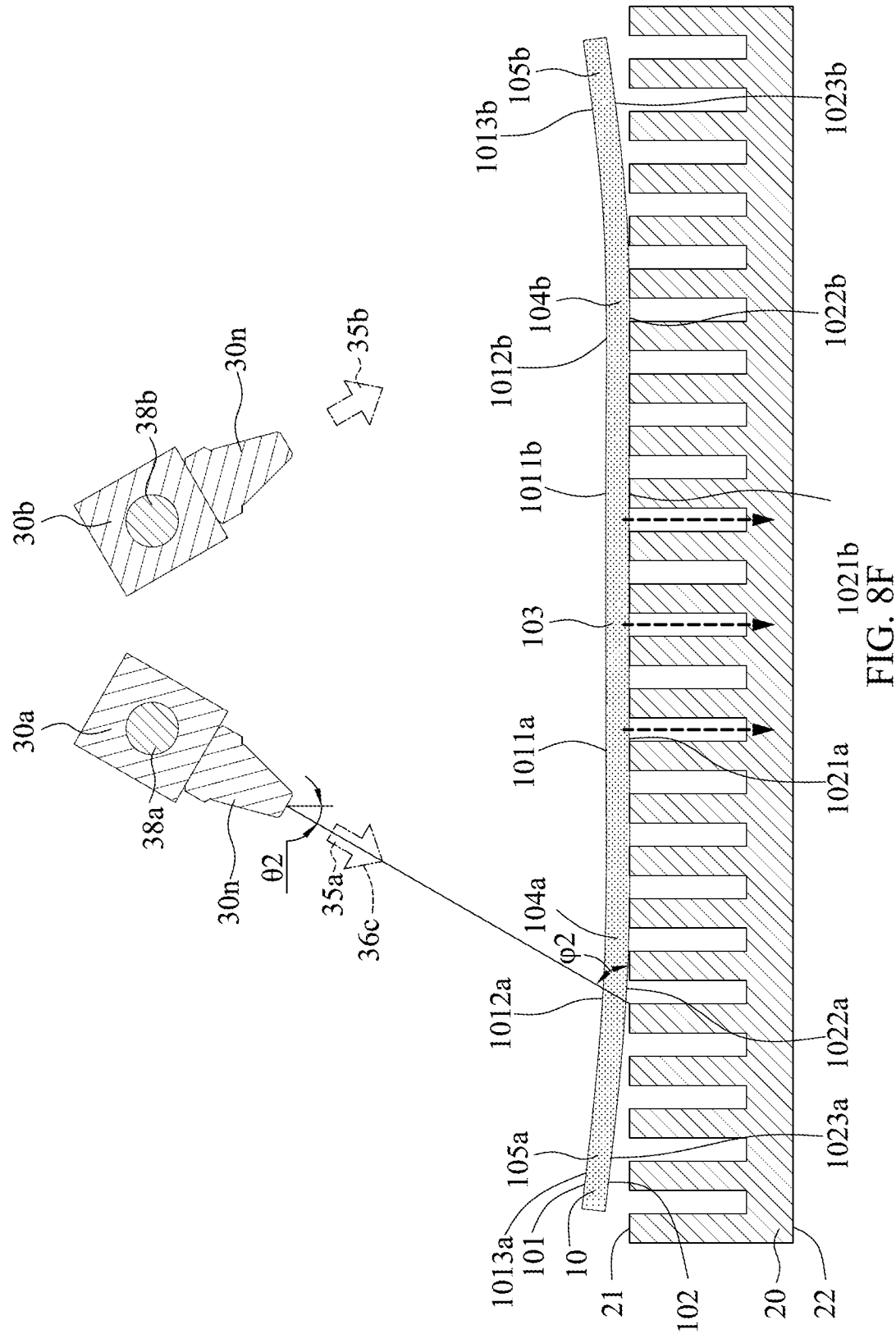
Figure 8G:
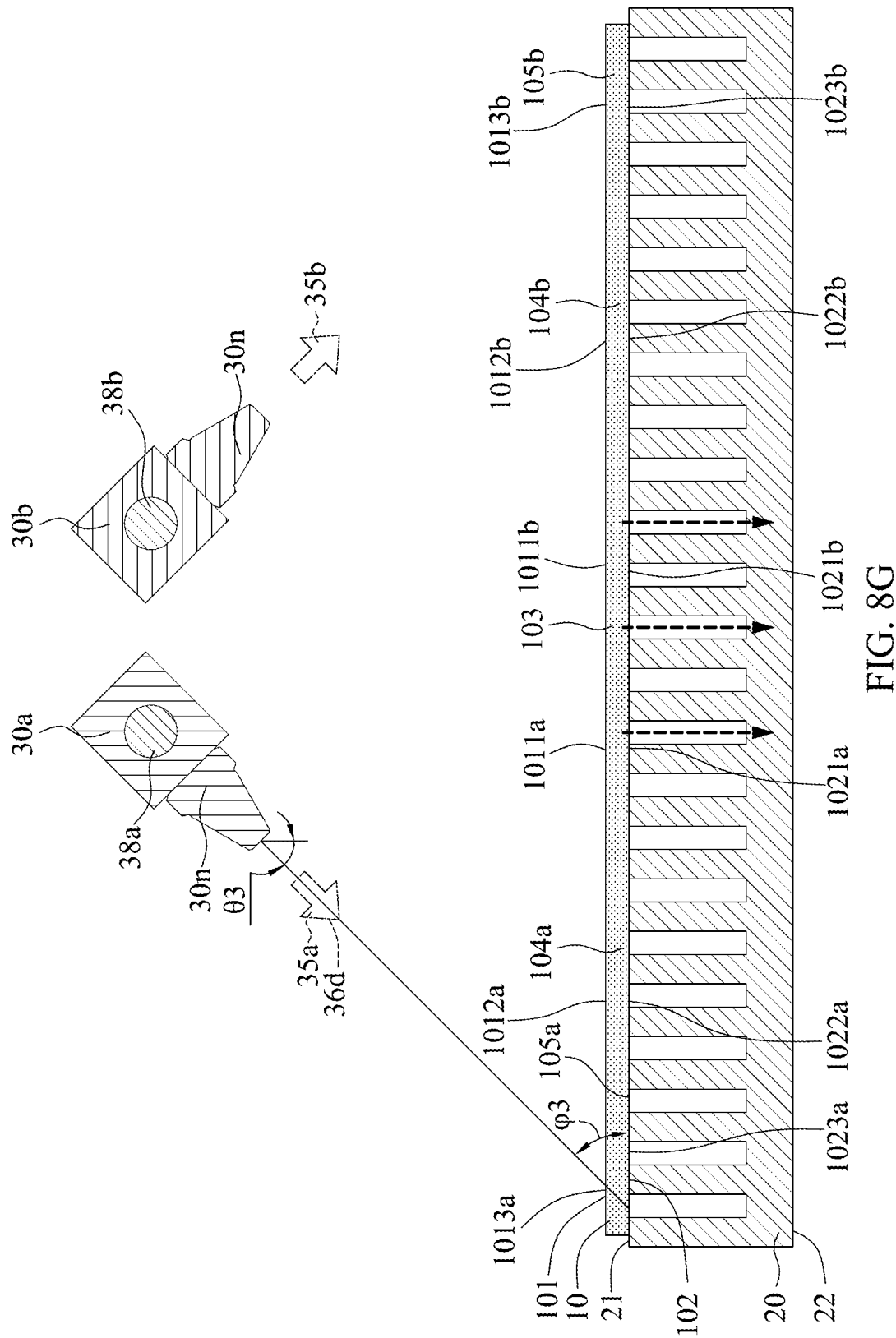

Referring to FIG. 8E, FIG. 8F, and FIG. 8G, the direction of the airflow 35a can be adjusted by rotating the air supply device 30a along the shaft 38a and the direction of the airflow 35b can be adjusted by rotating the air supply device 30b along the shaft 38b. FIG. 8E is similar to FIG. 8B, except that the air supply devices 30a and 30b blowing different regions by rotating the same instead of moving. FIG. 8F is similar to FIG. 8C, except that the air supply devices 30a and 30b blowing different regions by rotating the same instead of moving. FIG. 8G is similar to FIG. 8D, except that the air supply devices 30a and 30b blowing different regions by rotating the same instead of moving.

Referring to FIG. 8E, the air supply device 30a can rotate clockwise along the shaft 38a, such that the direction of the airflow 35a can be non-perpendicular to the top surface 21 of the stage 20. The air supply device 30b can rotate anticlockwise along the shaft 38b, such that the direction of the airflow 35b can be non-perpendicular to the top surface 21 of the stage 20. In some embodiments, the direction 36b of the airflow 35a of the air supply device 30a can have an angle θ1 from the vertical direction. In some embodiments, the direction 36b is different from the direction 36a. In some embodiments, the angle φ1 is between the direction 36b of the airflow 35a and the top surface 21 of the stage 20. The angle φ1 is a complementary angle φf the angle θ1. In other words, a sum of the angle φ1 and the angle θ1 is 90 degree. The air supply device 30a can provide the airflow 35a to blow or press the first intermediate portion 104a of the panel 10 to contact the stage 20. In addition, the direction of the airflow 35b of the air supply device 30b can have an angle, from the vertical direction, substantially identical to or different from the angle θ1. The air supply device 30b can provide the airflow 30b to blow or press the second intermediate portion 104b of the panel 10 to contact the stage 20.

Referring to FIG. 8F, the air supply device 30a can further rotate clockwise along the shaft 38a. The direction 36c of the airflow 35a of the air supply device 30a can have an angle θ2 from the vertical direction. The angle θ2 can be greater than the angle θ1. In some embodiments, the direction 36c is different from the directions 36a and 36b. In some embodiments, the angle φ2 is between the direction 36c of the airflow 35a and the top surface 21 of the stage 20. The angle φ2 is a complementary angle φf the angle θ2. In other words, a sum of the angle φ2 and the angle θ2 is 90 degree. The air supply device 30a can provide the airflow 35a to blow or press the first intermediate portion 104a of the panel 10, and the first periphery portion 105a. Thus, a negative pressure may be created between the first intermediate portion 104a of the panel 10 and the stage 20. In some embodiments, the air supply device 30b can further rotate anticlockwise along the shaft 38b. The direction of the airflow 35b of the air supply device 30b can have an angle, from the vertical direction, substantially identical to or different from the angle θ2. The air supply device 30b can provide the airflow 35b to blow or press the second intermediate portion 104b of the panel 10, and the second periphery portion 105b. Thus, a negative pressure may be created between the second intermediate portion 104b of the panel 10 and the stage 20. However, meanwhile, the first periphery portion 105a and the second periphery portion 105b of the panel 10 may be separated from or spaced apart from the stage 20.

Referring to FIGS. 8E and 8F, the angle θ1 is less than the angle θ2. The angle φ1 between the direction 36b of the airflow 35a and the top surface 21 of the stage 20 is greater than the angle φ2 between the direction 36c of the airflow 35a and the top surface 21 of the stage 20.

Referring to FIG. 8E, the air supply device 30a can rotate clockwise along the shaft 38a, and the air supply device 30b can rotate anticlockwise along the shaft 38b. In some embodiments, the direction 36b of the airflow 35a of the air supply device 30a can have the angle θ1 from the vertical direction. Therefore, the air supply device 30a can provide the airflow 35a to blow or press the intermediate region 1012a of the top surface 101 of the panel 10, so that the intermediate region 1022a of the bottom surface 102 of the panel 10 can contact the stage 20. In addition, the direction of the airflow 35b of the air supply device 30b can have an angle, from the vertical direction, substantially identical to or different from the angle θ1. The air supply device 30b can provide the airflow 30b to blow or press the intermediate region 1012b of the top surface 101 of the panel 10, so that the intermediate region 1022b of the bottom surface 102 of the panel 10 can contact the stage 20.

Referring to FIGS. 8A and 8E, the air supply device 30a can provide the airflow 35a to blow or press the center region 1011a of the top surface 101 of the panel 10, such that the distance D11 between the center region 1021a of the bottom surface 102 of the panel 10 and the stage 20 can be decreased to the distance D11", and then the center region 1021a of the bottom surface 102 can contact the stage 20. That is, the distance D11" in FIG. 8E is less than the distance D11 in FIG. 8A. Thus, a negative pressure may be created between the center region 1021a of the bottom surface 102 of the panel 10 and the stage 20.

The air supply device 30a can provide the airflow 35a to blow or press the intermediate region 1012a of the top surface 101 of the panel 10, such that the distance D21 between the intermediate region 1022a of the bottom surface 102 of the panel 10 and the stage 20 can be decreased to the distance D21", and then the intermediate region 1022a of the bottom surface 102 can contact the stage 20. That is, the distance D21" in FIG. 8E is less than the distance D21 in FIG. 8A. Thus, a negative pressure may be created between the intermediate region 1022a of the bottom surface 102 of the panel 10 and the stage 20.

Referring to FIG. 8F, the air supply device 30a can further rotate clockwise along the shaft 38a. The direction 36c of the airflow 35a of the air supply device 30a can have the angle θ2 from the vertical direction greater than the angle θ1. The air supply device 30a can provide the airflow 35a to blow or press the intermediate region 1012a and the periphery region 1013a of the top surface 101 of the panel 10. Thus, a negative pressure may be created between the intermediate region 1022a the bottom surface 102 of the panel 10 and the stage 20. In some embodiments, the air supply device 30b can further rotate anticlockwise along the shaft 38b. The direction of the airflow 35b of the air supply device 30b can have an angle, from the vertical direction, substantially identical to or different from the angle θ2. The air supply device 30b can provide the airflow 35b to blow or press the intermediate region 1012b and the periphery region 1013b of the top surface 101 of the panel 10. Thus, a negative pressure may be created between the intermediate region 1022b of the bottom surface 102 of the panel 10 and the stage 20.

Referring to FIG. 8G, the air supply device 30a can further rotate clockwise along the shaft 38a. The direction 36d of the airflow 35a of the air supply device 30a can have an angle θ3 from the vertical direction. The angle θ3 can be greater than the angles θ1 and θ2. In some embodiments, the direction 36d is different from the directions 36a, 36b, and 36c. In some embodiments, the angle φ3 is between the direction 36d of the airflow 35a and the top surface 21 of the stage 20. The angle φ3 is a complementary angle φf the angle θ3. In other words, a sum of the angle φ3 and the angle θ3 is 90 degree. Referring to FIGS. 8E, 8F, and 8G, the angle θ2 is greater than the angle θ3. The angle φ2 between the direction 36c of the airflow 35a and the top surface 21 of the stage 20 is greater than the angle 3 between the direction 36d of the airflow 35a and the top surface 21 of the stage 20. The air supply device 30a can provide the airflow 35a to blow or press the first intermediate portion 104a and the first periphery portion 105a of the panel 10. Thus, a negative pressure may be created between the first periphery portion 105a of the panel 10 and the stage 20. Thereby, the first periphery portion 105a of the panel 10 may be sucked and fixed on the stage 20.

In addition, the air supply device 30b can further rotate anticlockwise along the shaft 38b. The direction of the airflow 35b of the air supply device 30b can have an angle, from the vertical direction, substantially identical to or greater than the angle θ2. The air supply device 30b can provide the airflow 35b to blow or press the second intermediate portion 104b and the second periphery portion 105b of the panel 10. Thus, a negative pressure may be created between the second periphery portion 105b of the panel 10 and the stage 20. Thereby, the first periphery portion 105a of the panel 10 may be sucked and fixed on the stage 20. Thereby, the second periphery portion 105b of the panel 10 may be sucked and fixed on the stage 20.

As shown in FIGS. 8A, 8E, 8F and 8G, the warped panel 10 can be flattened with the pressure provided by the air supply devices 30a and 30b. The air supply devices 30a and 30b can press the top surface 101 of the panel 10, and the stage 20 can suck the bottom surface 102 of the panel 10. Accordingly, the warped panel 10 can be flattened and sucked on the stage 20.

In some embodiments, the first force (for example, the airflow 35a) is applied to the first region (for example, the center region 1011a) of the upper surface 101 of the panel 10 along a first direction (for example, the direction 36b in FIG. 8E) of the at least one direction, wherein the first force is applied to the second region (for example, the intermediate region 1012a) of the upper surface 101 of the panel 10 along a second direction (for example, the direction 36c in FIG. 8F) of the at least one direction. In some embodiments, a first angle (such as the angle $\phi 1$) between the first direction (i.e., the direction 36b) and the surface (for example, the top surface 21 of the stage 20) is greater than a second angle (such as the angle $\phi 2$) between the second direction (i.e., the direction 36c) and the surface (for example, the top surface 21 of the stage 20).

FIG. 9 illustrates a cross-sectional view of an apparatus 1 for flattening a workpiece according to some embodiments of the present disclosure. The apparatus 1 in FIG. 9 is similar to the apparatus 1 in FIG. 1, except that the panel 10a is a different warpage type. Referring to FIG. 9, the panel 10a placed on the stage 20 is concave. The warpage of the panel 10a may be referred to as a smiling face. In some embodiments, the air supply device 30 can provide airflows through the nozzles 30n toward the panel 10a, such that the panel 10a can be flattened and sucked on the stage 20. In some embodiments, the air supply device 30 can firstly press a portion of the panel 10a in contact with the stage 20. The air supply device 30 can then press another portion of the panel 10a spaced apart from the stage 20 (i.e., not contacting the stage 20). For example, the air supply device 30 can firstly press the center portion 103 of the panel 10a through the airflows 31, then press the intermediate portions 104 of the panel 10a through the airflows 32a, 32b, and finally press the periphery portions 105 of the panel 10a through the airflow 33a, 33b. That is, the airflows 31, 32a, 32b, 33a, 33b are applied to the panel 10a in a manner that corresponds to the warpage of the panel 10a.

FIG. 10 illustrates a cross-sectional view of an apparatus 1 for flattening a workpiece according to some embodiments of the present disclosure. The apparatus 1 in FIG. 10 is similar to the apparatus 1 in FIG. 1, except that the panel 10b is a different warpage type. Referring to FIG. 10, the panel 10b placed on the stage 20 is convex. The warpage of the panel 10b may be referred to as a crying face. In some embodiments, the air supply device 30 can provide airflows through the nozzles 30n toward the panel 10b, such that the panel 10b can be flattened and sucked on the stage 20. In some embodiments, the air supply device 30 can first press a portion of the panel 10b in contact with the stage 20, and then press another portion of the panel 10b spaced apart from the stage 20 (i.e., not contacting the stage 20). In some embodiments, the air supply device 30 can press the panel 10b from one side to another side. For example, the panel 10b can be pressed from the left side to the right side by the airflows supplied by the air supply device 30. In some embodiments, the air supply device 30 can press the periphery portions 105a, the intermediate portions 104a, the center portion 103, the intermediate portions 104b and the periphery portions 105b of the panel 10b in sequence by the airflows 33a, 32a, 31, 32b, 33b supplied by the air supply device 30 in sequence. That is, the airflows 33a, 32a, 31, 32b, 33b are applied to the panel 10b in a manner that corresponds to the warpage of the panel 10b. In some embodiments, the panel 10b can be pressed from the right side to the left side by the airflows supplied by the air supply device 30.

FIG. 11 illustrates a cross-sectional view of an apparatus 1 for flattening a workpiece according to some embodiments of the present disclosure. The apparatus 1 in FIG. 11 is similar to the apparatus 1 in FIG. 1, except that the panel 10c is a different warpage type. Referring to FIG. 11, the panel 10c placed on the stage 20 is in a W-shape. In some embodiments, the air supply device 30 can provide airflows toward the panel 10c, such that the panel 10c can be flattened and sucked on the stage 20. In some embodiments, the air supply device 30 can firstly press the center portion 103 of the panel 10c through the airflows 31, then press the intermediate portions 104 of the panel 10c through the airflows 32a, 32b, and finally press the periphery portions 105 of the panel 10c through the airflow 33a, 33b. That is, the airflows 31, 32a, 32b, 33a, 33b are applied to the panel 10c in a manner that corresponds to the warpage of the panel 10c. In another embodiment, the air supply device 30 can press the panel 10c from the left side to the right side. The air supply device 30 can press the panel 10c from the right side to the left side.

Figure 12:
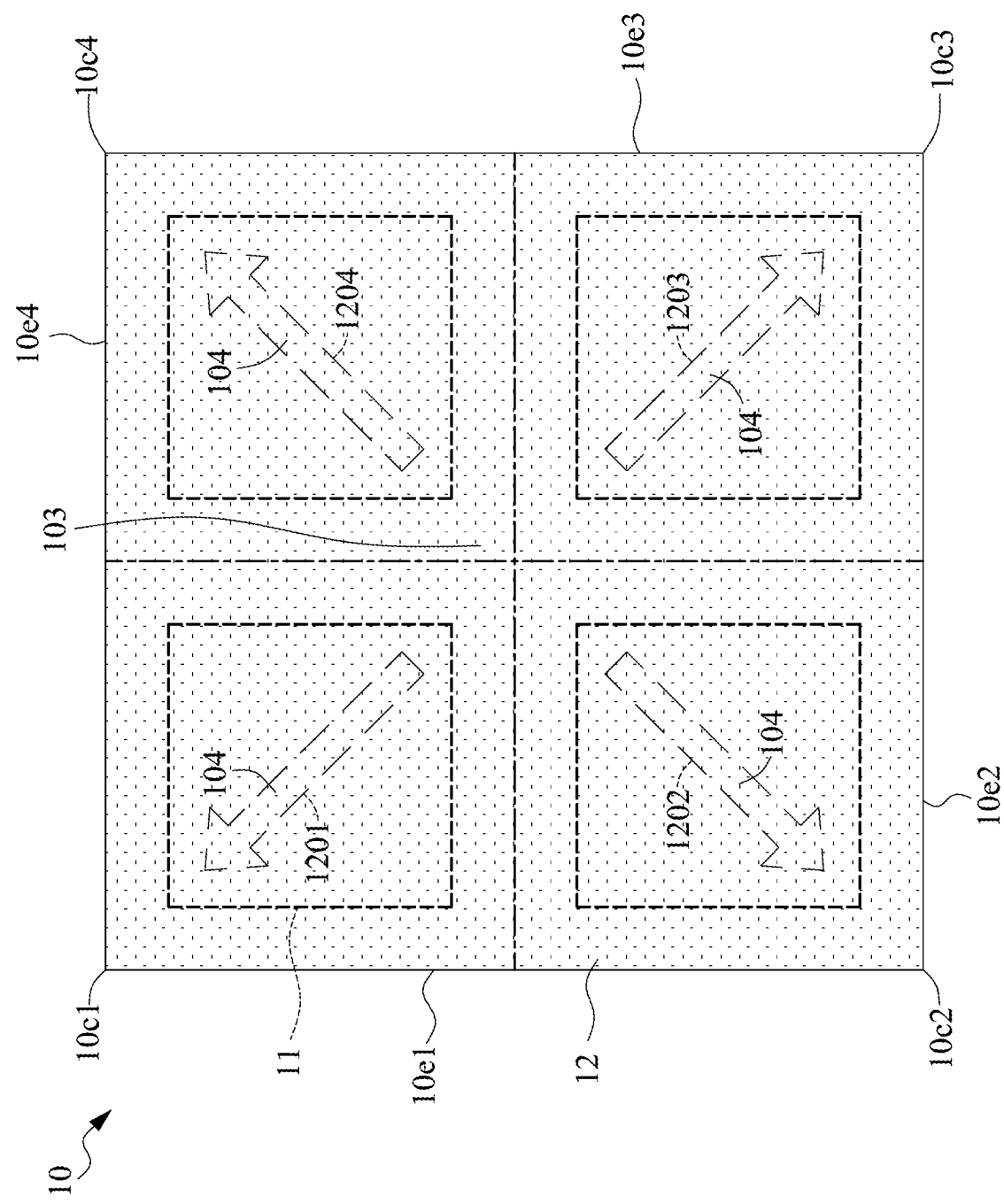
FIG. 12 illustrates a top view of one or more stages of an example of a method for manufacturing a semiconductor package structure according to some embodiments of the present disclosure.

FIG. 12 illustrates a top view of one or more stages of an example of a method for manufacturing a semiconductor package structure according to some embodiments of the present disclosure. FIG. 12 shows directions (e.g., movement directions or applying sequences) 1201, 1202, 1203, and 1204 of airflows applied to the panel 10. Referring to FIG. 12, the panel 10 includes a center portion 103, four sides (or edges) 10e1, 10e2, 10e3, and 10e4, and four corners 10c1, 10c2, 10c3, and 10c4.

In some embodiments, the corner 10c1 is opposite to the corner 10c3, and the corner 10c2 is opposite to the corner 10c4. The corners 10c1 and 10c2 can define the side 10e1 of the panel 10. The corners 10c1 and 10c4 can define the side 10e4 of the panel 10. The corners 10c2 and 10c3 can define the side 10e2 of the panel 10. The corners 10c3 and 10c4 can define the side 10e3 of the panel 10.

In some embodiments, the center portion 103 of the panel 10 is located in the middle of the panel 10. The center portion 103 may locate between the corners 10c1 and 10c3. The center portion 103 may locate between the corners 10c2 and 10c4.

Referring to FIG. 12, each of the arrows 1201, 1202, 1203, and 1204 may denote the direction that an airflow moves. For example, the arrow 1201 may denote the direction that an airflow moves along the direction from the center portion 103 to the corner 10c1 of the panel 10. Alternatively, each of the arrows 1201, 1202, 1203, and 1204 may denote a sequence that airflows applied to the panel 10. For example, the arrow 1201 may denote the direction that an airflow is applied to the center portion 103 of the panel 10, then other airflows are applied to the panel 10 in sequence along the direction from the center portion 103 to the corner 10c1 of the panel 10.

Referring to FIG. 12, four directions 1201, 1202, 1203, and 1204 for airflows are provided. In some embodiments, the airflows can be applied to the center portion 103 of the panel 10, then move from the center portion 103 to at least one corner 10c1, 10c2, 10c3, or 10c4 of the panel 10. Alternatively, the airflows can be applied to the panel 10 from the center portion 103 of the panel 10 to the corners 10c1, 10c2, 10c3, and 10c4 of the panel 10 in sequence. For example, the airflows can be applied to the center portion 103, to an intermediate portion 104 between the center portion 103 and the corner 10c1, and then to the corner 10c1 of the panel 10 along the direction 1201. The airflows can be applied to the center portion 103, to an intermediate portion 104 between the center portion 103 and the corner 10c2, and then to the corner 10c2 of the panel 10 along the direction 1202. The airflows can be applied to the center portion 103, to an intermediate portion 104 between the center portion 103 and the corner 10c3, and then to the corner 10c3 of the panel 10 along the direction 1203. The airflows can be applied to the center portion 103, to an intermediate portion 104 between the center portion 103 and the corner 10c4, and then to the corner 10c4 of the panel 10 along the direction 1204. In some embodiments, the airflows may be applied along the four directions 1201, 1202, 1203, and 1204 simultaneously.

In some embodiments, the air supply device 30 (as shown in FIG. 1) providing the airflows above the panel 10 can move along the direction 1201, 1202, 1203, or 1204. The air supply device 30 can move from a position corresponding to the center portion 103 of the panel 10 to another position corresponding to the corner 10c1, 10c2, 10c3, or 10c4 of the panel 10.

In some embodiments, the pressure of the airflows supplied by the air supply device 30 can increase along the directions 1201, 1202, 1203, or 1204 gradually. That is, the pressure of the airflows toward the panel 10 can increase from the center portion 103 to the corner 10c1 gradually. The pressure of the airflows toward the panel 10 can increase from the center portion 103 to the corner 10c2 gradually. The pressure of the airflows toward the panel 10 can increase from the center portion 103 to the corner 10c3 gradually. The pressure of the airflows toward the panel 10 can increase from the center portion 103 to the corner 10c4 gradually.

In some embodiments, the airflows provided by the air supply device 30 toward the panel 10 can stop applying when the negative pressure 29 (as shown in FIG. 1) between the panel 10 and the stage 20 (as shown in FIG. 1) is created. In some embodiments, after the negative pressure between the center portion 103 of the panel 10 and the stage 20 is created, the airflows provided by the air supply device 30 can stop applying to the center portion 103 of the panel 10. In another embodiment, after the negative pressure between the corner 10c1, 10c2, 10c3, or 10c4 of the panel 10 and the stage 20 is created, the airflows provided by the air supply device 30 can stop applying to the corner 10c1, 10c2, 10c3, or 10c4 of the panel 10.

The air supply device 30 can stop applying airflows to the center portion 103 and then stop applying airflows to the corner 10c1 of the panel 10 along the direction 1201. The air supply device 30 can stop applying airflows to the center portion 103 and then stop applying airflows to the corner 10c2 of the panel 10 along the direction 1202. The air supply device 30 can stop applying airflows to the center portion 103 and then stop applying airflows to the corner 10c3 of the panel 10 along the direction 1203. The air supply device 30 can stop applying airflows to the center portion 103 and then stop applying airflows to the corner 10c4 of the panel 10 along the direction 1204.

Figure 13:
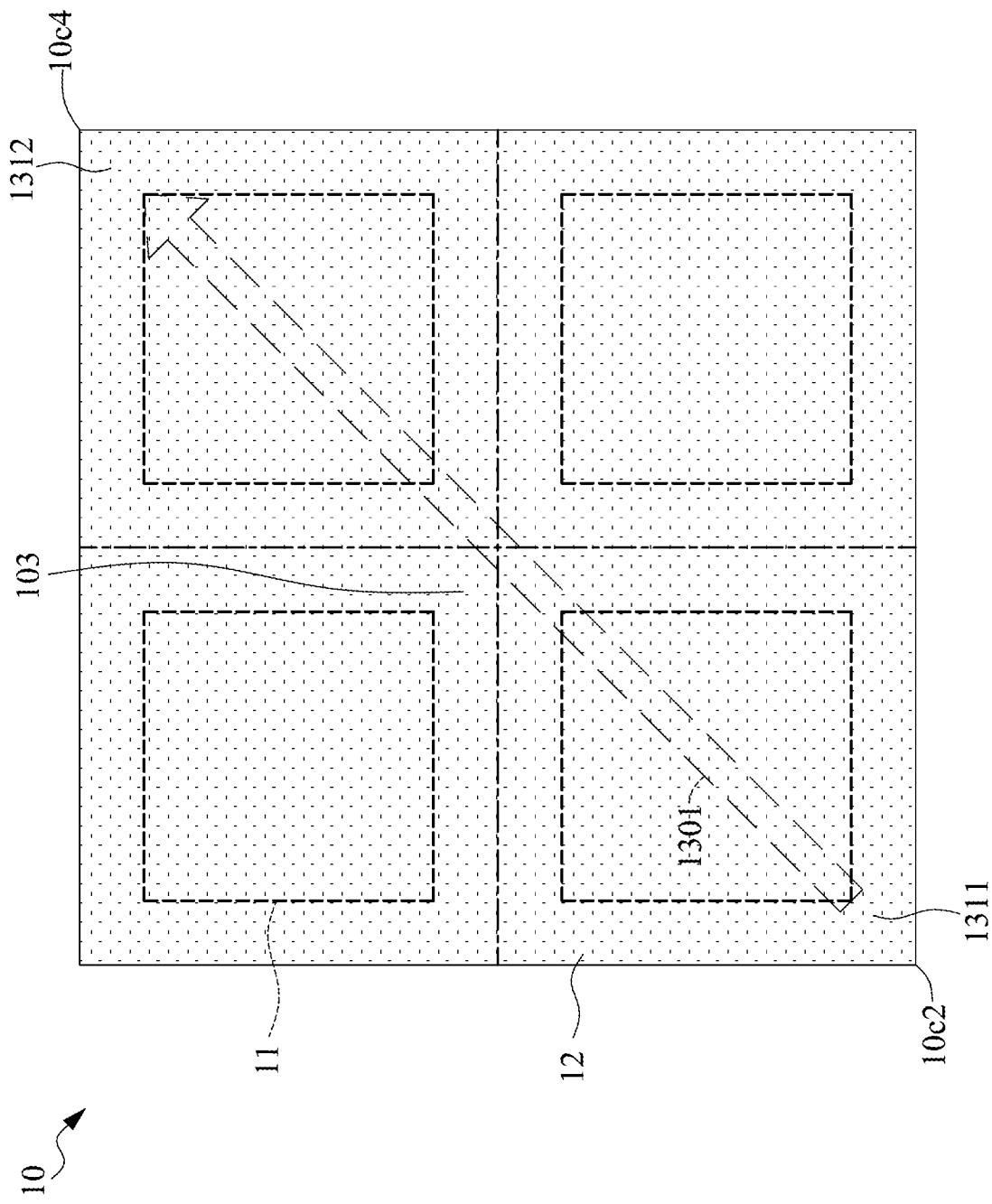
FIG. 13 illustrates a top view of one or more stages of an example of a method for manufacturing a semiconductor package structure according to some embodiments of the present disclosure.

FIG. 13 illustrates a top view of one or more stages of an example of a method for manufacturing a semiconductor package structure according to some embodiments of the present disclosure. FIG. 13 shows a direction 1301 of airflows applied to the panel 10. Referring to FIG. 13, the panel 10 includes two corners 10c2 and 10c4. In some embodiments, the corner 10c2 is opposite to the corner 10c4. The corners 10c2 and 10c4 can define a diagonal line of the panel 10.

In some embodiments, the airflows can be applied to the panel 10 from the corner 10c2 to the corner 10c4 of the panel 10. The airflow is applied to the panel 10 from the corner 10c2 to the corner 10c4 of the panel 10 in sequence. For example, the airflows can be applied to the corner 10c2, to the center portion 103, and then to the corner 10c4 of the panel 10 along the direction 1301. The airflows can be applied to the panel 10 along any other diagonal directions.

In some embodiments, the air supply device 30 (as shown in FIG. 1) providing the airflows above the panel 10 can move along the direction 1301. The air supply device 30 can move from a position corresponding to the corner 10c2 of the panel 10 to another position corresponding to the corner 10c4 of the panel 10. In another embodiment, the stage 20 (as shown in FIG. 1) supporting the panel 10 can move relative to the air supply device 30 above the panel 10 along a direction opposite to the direction 1301, such that the airflows can be applied to the panel along the direction 1301.

In some embodiments, the pressure of the airflows supplied by the air supply device 30 can increase along the direction 1301 gradually. That is, the pressure of the airflows toward the panel 10 can increase from the corner 10c2 to the corner 10c4 gradually.

In some embodiments, the airflows provided by the air supply device 30 toward the panel 10 can stop applying when the negative pressure (such as the negative pressure 29) between the panel 10 and the stage 20 is created. For example, after the negative pressure between the corner 10c2 of the panel 10 and the stage 20 is created, the airflows provided by the air supply device 30 can stop applying to the corner 10c2 of the panel 10. In another embodiment, after the negative pressure between the corner 10c4 of the panel 10 and the stage 20 is created, the airflows provided by the air supply device 30 can stop applying to the corner 10c4 of the panel 10. The air supply device 30 can stop applying airflows to the corner 10c2 and then stop applying airflows to the corner 10c4 of the panel 10 along the direction 1301.

In some embodiments, the upper surface of the panel 10 can include a first region 1311 adjacent to the corner 10c2 of the panel 10 and a second region 1312 adjacent to the corner 10c4 of the panel 10. In some embodiments, the first region 1311 is adjacent to a first corner (i.e., the corner 10c2) of the panel 10 and the second region 1312 is adjacent to a second corner (i.e., the corner 10c4) of the panel 10 from a top view.

In some embodiments, the method for manufacturing a semiconductor package can include applying a first force (such as pressure of the airflow of the air supply device 30 in FIG. 1) to the first region 1311 of the upper surface of the panel 10 (along at least one direction from the panel 10 toward the stage 20 as shown in FIG. 1), and transferring the first force (i.e., moving the air supply device 30) from the first region 1311 to a second region 1312 of the upper surface of the panel 10 different from the first region 1311. In some embodiments, the airflows can be applied to the first region 1311 of the upper surface of the panel 10, adjacent to the first corner (i.e., the corner 10c2), and then to the second region 1312 of the upper surface of the panel 10, adjacent to the second corner (i.e., the corner 10c4) along the direction 1301. The first corner (i.e., the corner 10c2) of the panel 10 and the second corner (i.e., the corner 10c4) of the panel 10 are in a diagonal relation.

Figure 14:
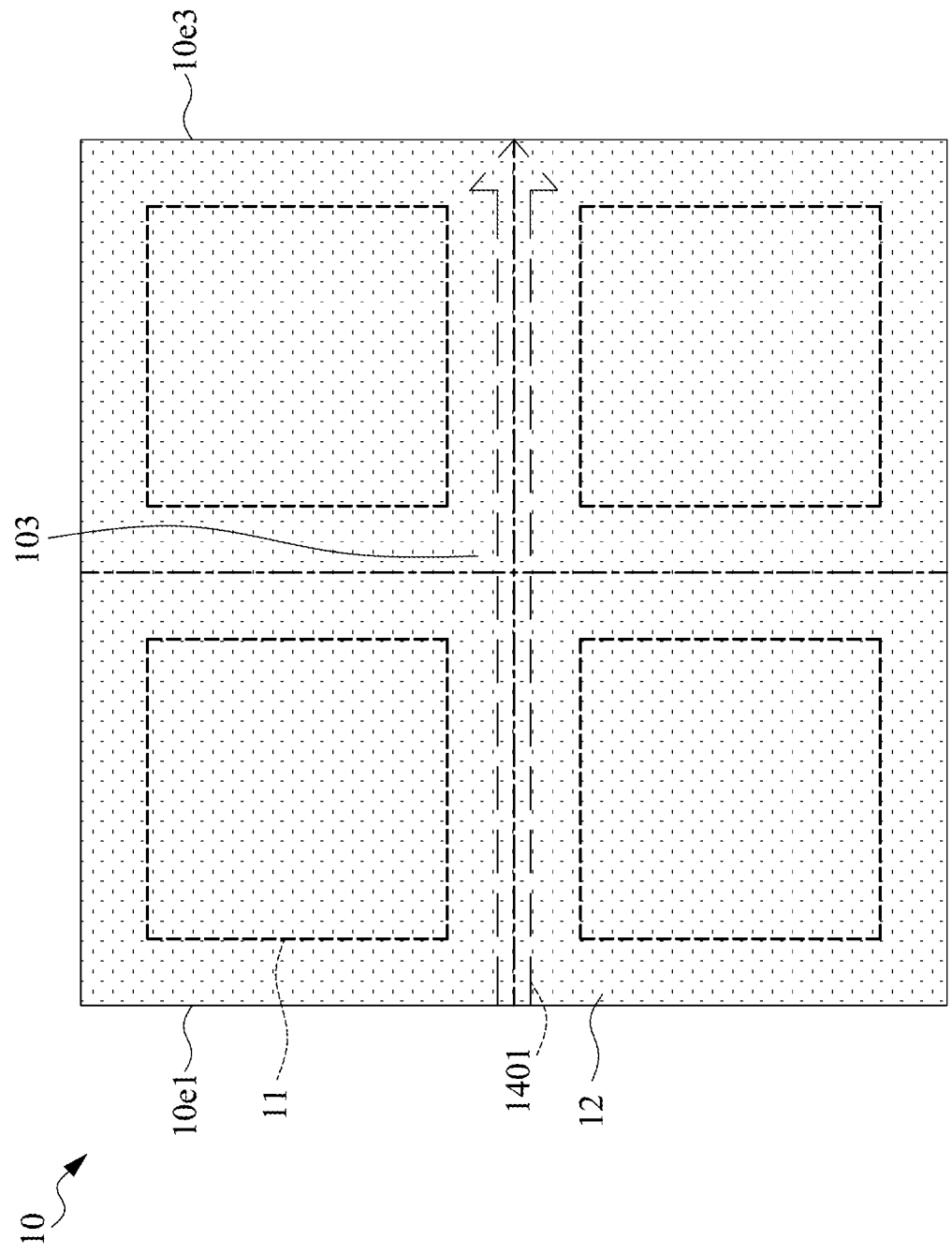
FIG. 14 illustrates a top view of one or more stages of an example of a method for manufacturing a semiconductor package structure according to some embodiments of the present disclosure.

FIG. 14 illustrates a top view of one or more stages of an example of a method for manufacturing a semiconductor package structure according to some embodiments of the present disclosure. FIG. 14 shows a direction 1401 of airflows applied to the panel 10. Referring to FIG. 14, the panel 10 includes two sides 10e1 and 10e3.

In some embodiments, the side 10e1 is opposite to the side 10e3. The side 10e1 can be parallel to the side 10e3. In some embodiments, the sides 10e1 and 10e3 can extend vertically.

In some embodiments, the airflows can be applied to the panel 10 from the side 10e1 to the side 10e3 of the panel 10. The airflows can be applied to the panel 10 from the side 10e1 to the side 10e3 of the panel 10 in sequence. For example, the airflows can be applied to the side 10e1, to the center portion 103, and then to the side 10e3 of the panel 10 along the direction 1401. The airflows can be applied to the panel 10 along any other directions from one side to another (such as horizontal or vertical).

In some embodiments, the air supply device 30 (as shown in FIG. 1) providing the airflows above the panel 10 can move along the direction 1401. The air supply device 30 can move from a position corresponding to the side 10e1 of the panel 10 to another position corresponding to the side 10e3 of the panel 10. In another embodiment, the stage 20 (as shown in FIG. 1) supporting the panel 10 can move relative to the air supply device 30 above the panel 10 along a direction opposite to the direction 1401, such that the airflows of the air supply device 30 can be applied to the panel 10 along the direction 1401.

In some embodiments, the pressure of the airflows toward the panel 10 can increase along the direction 1401 gradually. That is, the pressure of the airflows toward the panel 10 can increase from the side 10e1 to the side 10e3 gradually.

In some embodiments, the airflows toward the panel 10 can stop applying when the negative pressure (such as the negative pressure 29) between the panel 10 and the stage 20 is created. For example, after the negative pressure between the side 10e1 of the panel 10 and the stage 20 is created, the airflows provided by the air supply device 30 can stop applying to the side 10e1 of the panel 10. In another embodiment, after the negative pressure between the side 10e3 of the panel 10 and the stage 20 is created, the airflows provided by the air supply device 30 can stop applying to the side 10e3 of the panel 10. The air supply device 30 can stop applying airflows to the side 10e1 and then stop applying airflows to the side 10e3 of the panel 10 along the direction 1401.

Figure 15:
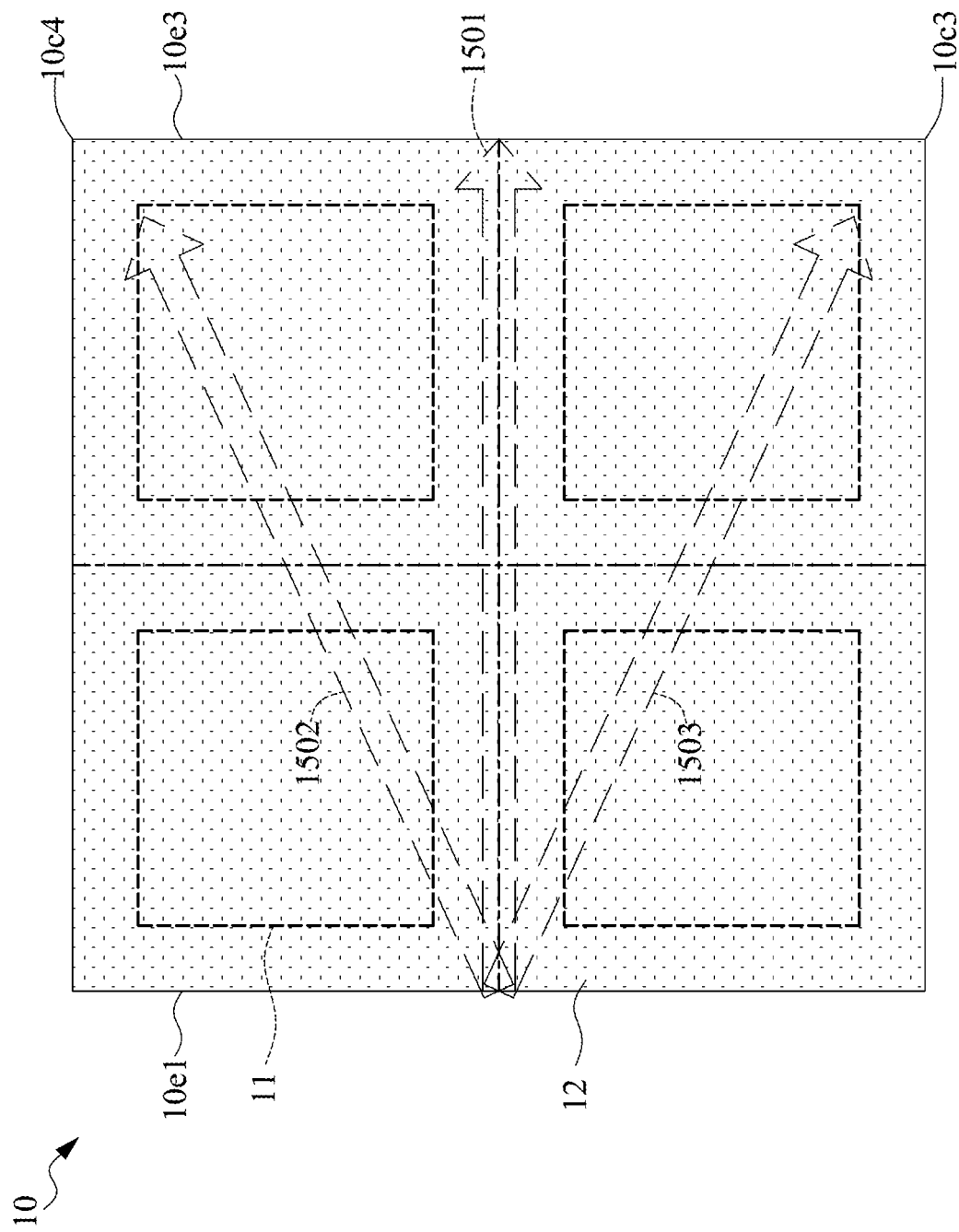
FIG. 15 illustrates a top view of one or more stages of an example of a method for manufacturing a semiconductor package structure according to some embodiments of the present disclosure.

FIG. 15 illustrates a top view of one or more stages of an example of a method for manufacturing a semiconductor package structure according to some embodiments of the present disclosure. FIG. 15 shows directions 1501, 1502, and 1503 of airflows applied to the panel 10. Referring to FIG. 15, the panel 10 includes two sides 10e1 and 10e3 and two corners 10c3 and 10c4. The method shown in FIG. 15 is similar to that in FIG. 14, except that additional directions 1502 and 1503 are further included.

In some embodiments, the airflows can be applied to the panel 10 from the side 10e1 to the side 10e3 of the panel 10. For example, the airflows can be applied to the panel 10 along the direction 1501. The airflows can be applied to the panel along the direction 1502. The airflows can be applied to the panel along the direction 1503.

In some embodiments, the direction 1501 can extend from the side 10e1 to the side 10e3. The direction 1501 can extend from the middle of the side 10e1 to the middle of the side 10e3. In some embodiments, the direction 1502 can extend from the side 10e1 to the side 10e3. For example, the direction 1502 can extend from the middle the side 10e1 to one end of the side 10e3 (i.e., the corner 10c4). In some embodiments, the direction 1503 can extend from the side 10e1 to the side 10e3. For example, the direction 1503 can extend from the middle the side 10e1 to another end of the side 10e3 (i.e., the corner 10c3).

In some embodiments, the airflows to the panel 10 can be applied along the directions 1501, 1502, and 1503 in sequence. That is, the airflows can be applied to the panel 10 from the side 10e1 of the panel 10 to two ends of the side 10e3 (i.e., the corners 10c3 and 10c4) of the panel 10. For example, the airflows to the panel 10 can be applied along the direction 1501 first, then applied along the direction 1502, and finally applied along the direction 1503. In another embodiment, the airflows to the panel 10 can be applied along the direction 1502 first, then applied along the direction 1501, and finally applied along the direction 1503. The airflows to the panel 10 can be applied along the direction 1503 first, then applied along the direction 1501, and finally applied along the direction 1502. In other embodiments, the airflows to the panel 10 can be applied along the directions 1501, 1502, and 1503 concurrently.

In some embodiments, the air supply device 30 (as shown in FIG. 1) providing the airflows above the panel 10 can move along the directions 1501, 1502, and 1503. In another embodiment, the stage 20 (as shown in FIG. 1) supporting the panel 10 can move relative to the air supply device 30 above the panel 10 along a direction opposite to the directions 1501, 1502, and 1503, such that the airflows can be applied to the panel 10 along the directions 1501, 1502, and 1503.

In some embodiments, the pressure of the airflows toward the panel 10 can increase along the direction 1501, 1502, or 1503 gradually. That is, the pressure of the airflows toward the panel 10 can increase from the side 10e1 to the side 10e3 gradually. The pressure of the airflows toward the panel 10 can increase from the side 10e1 to the corner 10c4 gradually. The pressure of the airflows toward the panel 10 can increase from the side 10e1 to the corner 10c3 gradually.

In some embodiments, after the negative pressure (such as the negative pressure 29) between the side 10e1 of the panel 10 and the stage 20 is created, the airflows provided by the air supply device 30 can stop applying to the side 10e1 of the panel 10. In another embodiment, after the negative pressure between the side 10e3 of the panel 10 and the stage 20 is created, the airflows provided by the air supply device 30 can stop applying to the side 10e3 of the panel 10. The air supply device 30 can stop applying airflows to the panel 10 along the direction 1501, 1502, or 1503.

Figure 16:
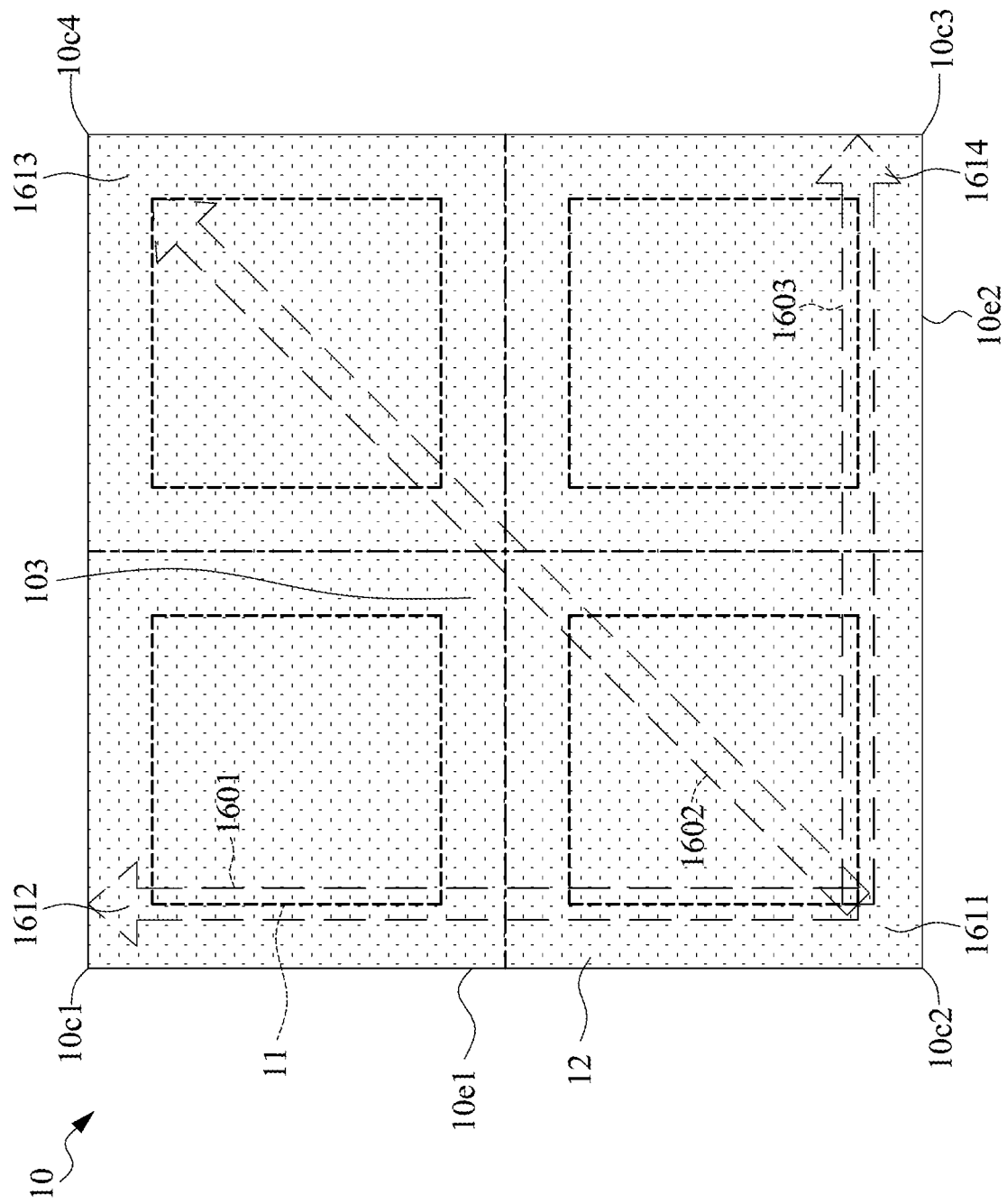
FIG. 16 illustrates a top view of one or more stages of an example of a method for manufacturing a semiconductor package structure according to some embodiments of the present disclosure.

FIG. 16 illustrates a top view of one or more stages of an example of a method for manufacturing a semiconductor package structure according to some embodiments of the present disclosure. FIG. 16 shows directions 1601, 1602, and 1603 of airflows applied to the panel 10. Referring to FIG. 16, the panel 10 includes sides 10e1 and 10e2, and corners 10c1, 10c2, 10c3 and 10c4. The method shown in FIG. 16 is similar to that in FIG. 13, except that additional directions 1601 and 1603 are further included.

The direction 1601 can extend from the corner 10c2 to the corner 10c1. The direction 1602 can extend from the corner 10c2 to the corner 10c4. The direction 1603 can extend from the corner 10c2 to the corner 10c3.

In some embodiments, the airflows can be applied to the panel 10 from the corner 10c2 to the corner 10c4 of the panel 10. For example, the airflows can be applied to the corner 10c2, to the center portion 103, and then to the corner 10c4 of the panel 10 along the direction 1602. In some embodiments, the airflows can be applied to the panel 10 from the corner 10c2 to the corner 10c1 of the panel 10 along the direction 1601. That is, the airflows can be applied to the panel 10 along the side 10e1 or a direction parallel to the side 10e1 (such as direction 1601). In some embodiments, the airflows can be applied to the panel 10 from the corner 10c2 to the corner 10c3 of the panel 10 along the direction 1603. That is, the airflows can be applied to the panel 10 along the side 10e2 or a direction parallel to the side 10e2 (such as direction 1603).

In some embodiments, the airflows to the panel 10 can be applied along the directions 1601, 1602, and 1603 in sequence. In some embodiments, the airflows can be applied to the panel 10 from one corner 10c2 of the panel 10 to other three corners 10c1, 10c3, and 10c4 of the panel 10 in sequence. For example, the airflows to the panel 10 can be applied along the direction 1601 first, then applied along the direction 1602, and finally applied along the direction 1603. In another embodiment, the airflows to the panel 10 can be applied along the direction 1602 first, then applied along the direction 1601, and finally applied along the direction 1603. The airflows to the panel 10 can be applied along the direction 1603 first, then applied along the direction 1601, and finally applied along the direction 1602. In other embodiments, the airflows to the panel 10 can be applied along the directions 1601, 1602, and 1603 concurrently.

In some embodiments, the air supply device 30 (as shown in FIG. 1) providing the airflows above the panel 10 can move along the directions 1601, 1602, and 1603. In another embodiment, the stage 20 (as shown in FIG. 1) supporting the panel 10 can move relative to the air supply device 30 above the panel 10 along a direction opposite to the directions 1601, 1602, and 1603, such that the airflows can be applied to the panel 10 along the directions 1601, 1602, and 1603.

In some embodiments, the pressure of the airflows toward the panel 10 can increase along the direction 1601 gradually. That is, the pressure of the airflows toward the panel 10 can increase from the corner 10c2 to the corner 10c1 gradually. In some embodiments, the pressure of the airflows toward the panel 10 can increase along the direction 1602 gradually. That is, the pressure of the airflows toward the panel 10 can increase from the corner 10c2 to the corner 10c4 gradually. In some embodiments, the pressure of the airflows toward the panel 10 can increase along the direction 1603 gradually. That is, the pressure of the airflows toward the panel 10 can increase from the corner 10c2 to the corner 10c3 gradually.

In some embodiments, the airflows toward the panel 10 can be stop applying when the negative pressure (such as the negative pressure 29) between the panel 10 and the stage 20 is created. For example, after the negative pressure between the corner 10c2 of the panel 10 and the stage 20 is created, the airflows provided by the air supply device 30 can stop applying to the corner 10c2 of the panel 10. In another embodiment, after the negative pressure between the corner 10c1 of the panel 10 and the stage 20 is created, the airflows provided by the air supply device 30 can stop applying to the corner 10c1 of the panel 10. That is, the air supply device 30 can stop applying airflows to the panel 10 along the direction 1601. In some embodiments, the air supply device 30 can stop applying airflows to the panel 10 along the direction 1602 or 1603.

In some embodiments, the upper surface of the panel 10 can include a first region 1611 adjacent to the corner 10c2 of the panel 10, a second region 1612 adjacent to the corner 10c1 of the panel 10, a third region 1613 adjacent to the corner 10c4 of the panel 10, and a fourth region 1016 adjacent to the corner 10c3 of the panel 10. In some embodiments, the first region 1611 is adjacent to a first corner (i.e., the corner 10c2) of the panel 10 and the second region 1612 is adjacent to a second corner (i.e., the corner 10c1) of the panel 10 from a top view.

In some embodiments, the method for manufacturing a semiconductor package can include applying a first force (such as pressure of the airflow of the air supply device 30 in FIG. 1) to the first region 1611 of the upper surface of the panel 10 (along at least one direction from the panel 10 toward the stage 20 as shown in FIG. 1), and transferring the first force (i.e., moving the air supply device 30) from the first region 1611 to a second region 1612 of the upper surface of the panel 10 different from the first region 1611.

In some embodiments, the airflows can be applied to the first region 1611 of the upper surface of the panel 10 (adjacent to the corner 10c2) and then to the second region 1612 of the upper surface of the panel 10 (adjacent to the corner 10c1) along the direction 1601. In some embodiments, the airflows can be applied to the first region 1611 of the upper surface of the panel 10, adjacent to the first corner (i.e., the corner 10c2), and then to the third region 1613 of the upper surface of the panel 10, adjacent to the second corner (i.e., the corner 10c4) along the direction 1602. The first corner (i.e., the corner 10c2) of the panel 10 and the second corner (i.e., the corner 10c4) of the panel 10 are in a diagonal relation. In some embodiments, the airflows can be applied to the first region 1611 of the upper surface of the panel 10, adjacent to the first corner (i.e., the corner 10c2), and then to the fourth region 1614 of the upper surface of the panel 10, adjacent to the second corner (i.e., the corner 10c3) along the direction 1603.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to #1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to #1%, less than or equal to ±0.5%, less than or equal to =0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, a characteristic or quantity can be deemed to be "substantially" consistent if a maximum numerical value of the characteristic or quantity is within a range of variation of less than or equal to +10% of a minimum numerical value of the characteristic or quantity, such as less than or equal to +5%, less than or equal to +4%, less than or equal to +3%, less than or equal to +2%, less than or equal to +1%, less than or equal to +0.5%, less than or equal to +0.1%, or less than or equal to +0.05%.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A method for manufacturing a semiconductor package, comprising:
   providing a panel over a stage, wherein the panel includes a lower surface facing the stage and an upper surface opposite to the lower surface;
   applying a first force to a first region of the upper surface of the panel along at least one direction from the panel toward the stage; and
   transferring the first force from the first region to a second region of the upper surface of the panel different from the first region,
   wherein applying the first force includes applying an airflow to the first region of the upper surface of the panel.

2. The method of claim 1, further comprising:
   sucking a third region of the lower surface of the panel after applying the first force, wherein the third region is opposite to the first region.

3. The method of claim 2, wherein sucking the third region of the lower surface of the panel is before transferring the first force to the second region.

4. The method of claim 2, wherein the third region is spaced apart from the stage by a first distance, wherein the lower surface of the panel includes a fourth region opposite to the second region and spaced apart from the stage by a second distance, wherein the second distance is greater than the first distance.

5. The method of claim 4, wherein applying the first force is configured to decreases the first distance.

6. The method of claim 5, wherein
   a negative pressure is created between the third region and the stage after the third region contacting the stage, such that the third region is sucked on the stage.

7. The method of claim 6, further comprising:
   eliminating the first force to the first region after the negative pressure is created.

8. The method of claim 1, wherein the second region is closer to an edge of the panel than the first region is.

9. The method of claim 8, further comprising:
   increasing a blowing force of the first force from the first region to the second region.

10. The method of claim 1, wherein the first region is adjacent to a first corner of the panel and the second region is adjacent to a second corner of the panel from a top view.

11. The method of claim 10, wherein the first corner of the panel and the second corner of the panel are in a diagonal relation.

12. The method of claim 1, wherein the at least one direction is non-perpendicular to a surface of the stage for supporting the panel.

13. The method of claim 12, wherein the first force is applied to the first region of the upper surface of the panel along a first direction of the at least one direction, wherein the first force is applied to the second region of the upper surface of the panel along a second direction of the at least one direction, and wherein a first angle between the first direction and the surface of the stage is greater than a second angle between the second direction and the surface of the stage.

14. The method of claim 1, wherein the airflow is supplied by an air knife.

15. The method of claim 1, wherein the airflow is supplied by an air supply device, wherein the air supply device includes a shaft and an outlet connected to the shaft, such that the shaft adjusts a direction of the airflow provided by the outlet.

16. A method for manufacturing a semiconductor package, comprising:
   providing a panel over a stage, wherein the panel includes a lower surface facing the stage and an upper surface opposite to the lower surface;
   applying a first airflow to a first region of the upper surface of the panel; and
   applying a second airflow to a second region of the upper surface of the panel, wherein a second blowing force of the second airflow is greater than a first blowing force of the first airflow.

17. The method of claim 16, wherein the first airflow is configured to reduce a static electricity of the panel.

18. The method of claim 16, wherein the panel includes an electronic component and an encapsulant encapsulating the electronic component to form the panel.

19. The method of claim 16, wherein the first airflow and the second airflow are supplied by an air supply device, wherein the air supply device includes a plurality of nozzles configured to provide a respective airflow toward different directions.

\* \* \* \* \*